(12) United States Patent
Williams et al.

(10) Patent No.: US 7,728,462 B2
(45) Date of Patent: Jun. 1, 2010

(54) MONOLITHIC STAGE DEVICES PROVIDING MOTION IN SIX DEGREES OF FREEDOM

(75) Inventors: Mark Williams, Amherst, NH (US); Alton H. Phillips, East Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 3 days.

(21) Appl. No.: 11/804,719

(22) Filed: May 18, 2007

(65) Prior Publication Data

US 2008/0012431 A1 Jan. 17, 2008

Related U.S. Application Data

(60) Provisional application No. 60/801,581, filed on May 18, 2006.

(51) Int. Cl.
*H02K 41/02* (2006.01)
(52) U.S. Cl. ................ 310/12; 355/53; 355/72
(58) Field of Classification Search .............. 310/12; 355/53, 72, 75
See application file for complete search history.

(56) References Cited

U.S. PATENT DOCUMENTS

| | | | |
|---|---|---|---|
| 3,935,486 A | 1/1976 | Nagashima | |
| 4,549,155 A | 10/1985 | Halbach | |
| 4,621,236 A | 11/1986 | Halbach | |
| H450 H | 3/1988 | Halbach | |
| 4,761,584 A | 8/1988 | Halbach | |
| 4,933,626 A | 6/1990 | Halbach et al. | |
| 4,952,858 A | 8/1990 | Galburt | |
| 5,157,296 A | 10/1992 | Trumper | |
| 5,294,854 A | 3/1994 | Trumper | |
| 5,296,891 A | 3/1994 | Vogt et al. | |
| 5,523,193 A | 6/1996 | Nelson | |
| 5,623,853 A | 4/1997 | Novak et al. | |
| 5,631,618 A | 5/1997 | Trumper et al. | |

(Continued)

FOREIGN PATENT DOCUMENTS

EP 1 160 628 A2 12/2001

(Continued)

OTHER PUBLICATIONS

U.S. Appl. No. 11/804,734, filed May 2007, Williams et al.

(Continued)

*Primary Examiner*—Michael C Zarroli
(74) *Attorney, Agent, or Firm*—Klarquist Sparkman, LLP

(57) ABSTRACT

Stage devices for various uses including use as a reticle stage or substrate stage in a microlithography system. An exemplary device includes a carrier and multiple linear EM actuators that couple the carrier monolithically to a base. The linear EM actuators collectively provide controlled movability of the carrier relative to the base in all six DOFs (X, Y, Z, $\theta_X$, $\theta_Y$, $\theta_Z$). The multiple linear EM actuators comprise at least one multiple-DOF linear actuator but fewer than six linear EM actuators. For example, the stage device can have two two-DOF linear actuators providing respective motions of the carrier in the X, Y and Y, Z DOFs (and collectively in all six DOFs) or can have two two-DOE linear actuators providing motions of the carrier in the Y, Z, $\theta_X$, $\theta_Y$, and $\theta_Z$ DOFs and a one-DOF linear actuator providing motions in the X DOF.

35 Claims, 11 Drawing Sheets

U.S. PATENT DOCUMENTS

| | | | |
|---|---|---|---|
| 5,699,621 | A | 12/1997 | Trumper et al. |
| 5,969,441 | A | 10/1999 | Loopstra et al. |
| 6,040,675 | A | 3/2000 | Ono |
| 6,208,407 | B1 | 3/2001 | Loopstra |
| 6,341,007 | B1 | 1/2002 | Nishi et al. |
| 6,353,271 | B1 | 3/2002 | Williams |
| 6,400,441 | B1 | 6/2002 | Nishi et al. |
| 6,549,269 | B1 | 4/2003 | Nishi et al. |
| 6,590,634 | B1 | 7/2003 | Nishi et al. |
| 6,741,332 | B2 * | 5/2004 | Nishi ............................ 355/72 |
| 6,816,232 | B2 * | 11/2004 | Takahashi et al. .............. 355/53 |
| 6,867,534 | B2 * | 3/2005 | Tanaka ........................ 310/328 |
| 6,879,127 | B2 | 4/2005 | Gery |
| 7,451,596 | B2 * | 11/2008 | Culpepper et al. ............. 60/527 |
| 2002/0151321 | A1 | 10/2002 | Winchell et al. |
| 2003/0052284 | A1 | 3/2003 | Hol et al. |
| 2003/0151321 | A1 * | 8/2003 | Gery .......................... 310/90.5 |
| 2003/0155882 | A1 | 8/2003 | Ono et al. |
| 2003/0173833 | A1 | 9/2003 | Hazelton et al. |
| 2005/0040712 | A1 * | 2/2005 | Hazelton ..................... 310/12 |
| 2008/0129128 | A1 * | 6/2008 | Compter et al. ................ 310/54 |

FOREIGN PATENT DOCUMENTS

| | | |
|---|---|---|
| GB | 1424413 | 11/1976 |
| JP | 10-163099 | 6/1998 |
| JP | 10-214783 | 8/1998 |
| JP | 11-135400 | 5/1999 |
| JP | 2000-505958 | 5/2000 |
| WO | WO 98/28665 | 7/1998 |
| WO | WO 98/33096 | 9/1998 |
| WO | WO 98/38597 | 9/1998 |
| WO | WO 99/49504 | 9/1999 |
| WO | WO 2006/007167 A2 | 1/2006 |

OTHER PUBLICATIONS

U.S. Appl. No. 11/750,604, filed May 2007, Binnard et al.

U.S. Appl. No. 11/750,545, filed May 2007, Binnard et al.

M.E. Williams et al., "Magnetic Levitation Scanning Stage for Extreme Ultraviolet Lithography," 14$^{th}$ Annual Meeting of the ASPE, Monterey, CA, 1999 Proceedings, vol. 20.

M. Williams et al., "Six Axis Active Vibration Isolation and Payload Reaction Force Compensation System," ASPE 13$^{th}$ Annual Meeting of ASPE, Cincinnati, Ohio 1997 Proceedings, vol. 16.

M. Williams et al., "Six Degree of Freedom Mag-Lev Stage Development," SPIE 22$^{nd}$ Annual International Symposium on Microlithography, Santa Clara, CA Mar. 1997, vol. 3051.

M.E. Williams et al., "Precision Magnetic Bearing Six Degree of Freedom Stage," NASA 3rd International Symposium on Magnetic Suspension Technology, Tallahassee, Fla, Dec. 1995.

D.L. Trumper et al., "Design and Analysis Framework for Linear Permanent Magnet Machines," IEEE Ind. App. Society Annual Meeting, Denver, Colorado, Oct. 1994.

D.L. Trumper et al., "Magnet Arrays for Synchronous Machines," IEEE Ind. App. Society Annual Meeting, Toronto, Canada Oct. 1993.

M.E. Williams et al., "Materials for Efficient High-Flux Magnetic Bearing Actuators," NASA 2$^{nd}$ International Symposium on Magnetic Suspension Technology, Seattle, WA Aug. 1993.

Klaus Halbach et al., "Application of Permanent Magnets in Accelerators and Electron Storage Rings," J. of Appl. Phys. 57(1), Apr. 15, 1985.

S.A.J. Hol. et al., "Design and Optimization of a Magnetic Gravity Compensator," Proc. of the 4$^{th}$ euspen International Conference, Glasgow, Scotland, UK, May-Jun. 2004, pp. 222-223.

J.C. Compter et al., "Six Degrees of Freedom Planar Motors," Proc. of 4$^{th}$ euspen International Conference—Glasgow, Scotland (UK), May-Jun. 2004, pp. 390-391.

PMB Projects, Passive Electromagnetic Suspension for Rotor Applications. http://dmtwww.epfl.ch/~jsandtne/GPMB/project1.htm, printed Mar. 11, 2004.

G.J.P. Nijsse et al., A New Zero-Stiffness Magnetic Bearing for Vibration Isolation, Proceeding of the American Society for Precision Engineering, vol. 16, 1997.

* cited by examiner

MONOLITHIC STAGE DEVICES PROVIDING MOTION IN SIX DEGREES OF FREEDOM

CROSS REFERENCE TO RELATED APPLICATION

This application claims priority to, and the benefit of, U.S. Provisional Application No. 60/801,581, filed on May 18, 2006, incorporated herein by reference.

FIELD

This disclosure pertains to, inter alia, devices comprising movable platforms, carriers, or analogous movable members used for placing an object relative to a tool such as a processing or imaging tool. Not intending to be limiting, a particular type of device within the scope of the disclosure is a movable stage as used for positioning a mask or reticle relative to illumination and/or imaging optics of a microlithography system. Microlithography is a key technique used in the fabrication of semiconductor microdevices, displays, and other devices having extremely small elements and patterns.

BACKGROUND

Many advances in modern technology involve or are accompanied by a need to position objects extremely accurately and precisely. One arena in which this need is felt is precision machining. Another arena is precision imaging. Yet another arena is inspection and testing. One arena in which this need is particularly acute is microlithography, which generally is a technique for imprinting patterns of circuit elements on substrates. Advancements in modern microlithography systems have achieved levels of printing accuracy, precision, and resolution that were unheard of only a few years ago. For example, it is now possible to print features less than 50 nm across. To achieve such results, modern microlithography systems are extremely complex and have a large number of subsystems that must operate at or near theoretical limits of performance. These subsystems include not only illumination and imaging optics but also devices for moving objects such as reticles and substrates, and devices for measuring positions of objects such as reticles and substrates.

The particular subsystems to which this disclosure is directed is any of various "stage" devices that hold an object, such as a reticle or substrate, and that move and position the object with extremely high accuracy and precision. Referring to FIG. 11, a conventional microlithography system 100 has at least one stage, and many systems have two or more stages, such as a reticle stage 102 and a substrate stage 104 used on many types of projection-microlithography systems. The reticle stage 102 is situated and configured to hold a pattern-defining master termed a "reticle" or "mask" (generally termed a "reticle" 106 herein). The substrate stage 104 is situated and configured to hold a "substrate" 108 (e.g., a semiconductor wafer or a display panel) onto which the pattern from the reticle 106 is projected for imprinting purposes. The conventional projection-microlithography system 100 also has an illumination-optical system 110, located upstream of the reticle stage 102, that conditions a beam of lithographic light (produced by a source 112) for illuminating the reticle 106, and a projection-optical system 114, located between the reticle stage and the substrate stage 104, that receives patterned lithographic light from the reticle and projects an image of the reticle pattern onto the substrate 108. The reticle stage 102 and substrate stage 104 are independently movable in at least one direction, especially relative to the projection-optical system 114, to ensure placement of the pattern image(s) at proper location(s) and with proper alignment on the substrate 108.

Further with respect to the conventional system 100, the reticle stage 102 includes a platform (also called a "fine stage") 102F, on which the reticle 106 is mounted, and a coarse stage 102C, on which the fine stage 102F is mounted. The coarse stage 102C is movable relative to a stage base 102B, and the fine stage 102F is movable relative to the coarse stage 102C. To achieve such motion, the coarse stage 102C is coupled to an actuator 102CA mounted to the base 102B, and the fine stage 102F is coupled to an actuator 102FA mounted to the coarse stage.

Similarly, the substrate stage 104 includes a platform (also called a "fine stage") 104F, on which the substrate 108 is mounted, and a coarse stage 104C, on which the fine stage 104F is mounted. The coarse stage 104C is movable relative to a stage base 104B, and the fine stage 104F is movable relative to the coarse stage 104C. To achieve such motion, the coarse stage 104C is coupled to an actuator 104CA mounted to the base 104B, and the fine stage 104F is coupled to an actuator 104FA mounted to the coarse stage.

For performing highly accurate positional measurements of the reticle coarse stage 102C relative to the base 102B and positional measurements of the reticle fine stage 102F, respective interferometers 116C, 116F are used. Similarly, for performing highly accurate positional measurements of the substrate coarse stage 104C relative to the base 104B and positional measurements of the reticle fine stage 104F, respective interferometers 118C, 118F are used. Typically, each interferometer 116F, 116C, 118F, 118C shown in FIG. 11 includes multiple interferometers including measurement interferometers and reference interferometers. The interferometers 116F, 116C, 118F, 118C ensure, inter alia, co-alignment of the reticle 106 and substrate 108 with the projection-optical system 114.

As microlithography systems have evolved over the years, the mechanisms of the stages 102, 104 have become increasingly sophisticated. Much of the impetus behind evolution of microlithography systems has focused on increased throughput and better (finer) imaging resolution. To achieve these goals, modern microlithography systems have had to operate at shorter wavelengths of lithographic light than previously (which has required extensive modifications of the source 112, the illumination-optical system 110, and projection-optical system 114), and have had to incorporate many changes and refinements in the stages 102, 104. For example, many conventional stages now utilize linear and/or planar motors as actuators, and the number and sophistication of interferometers have generally increased.

Demands on the achievable motions of the stages 102, 104 have also increased. For example, as the numerical aperture (N/A) of projection-optical systems has increased, the depth of field (also called depth of focus) of these systems has correspondingly decreased. Consequently, the accuracy, precision, and numbers of degrees of freedom (DOF) of stage motions have had to be improved. (Regarding the stage motions relative to Cartesian (X, Y, Z) rectangular coordinates, up to six DOF are available: X, Y, Z, $\theta_X$, $\theta_Y$, and $\theta_Z$) Whereas, for example, reticle stages are currently available that provide motion in three DOFs (X, Y, $\theta_Z$), the prospect of achieving all six DOF of motion in a single stage, especially such motions controlled to accuracy and precision in the nanometer range, has presented large technical challenges.

In addition to the above, obtaining better throughput and imaging resolution also requires stages that hold larger reticles and substrates, that accelerate and decelerate faster than previously, that move at higher velocities, and that produce less vibration. Achieving these goals also has presented large technical challenges. For example, increasing the ranges of motion and increasing acceleration, deceleration, and velocity usually results in increased size and mass of the stage and of the actuators. Hence, anything that can be done to reduce the mass of the stage without compromising stage performance would be beneficial.

SUMMARY

According to a first aspect, stage devices are provided. One embodiment of such a device comprises a carrier and multiple linear EM actuators (e.g., linear motors) coupling the carrier monolithically to a base. The linear EM actuators collectively provide controlled movability of the carrier relative to the base in all six degrees of freedom (DOFs), namely X, Y, Z, $\theta_X$, $\theta_Y$, and $\theta_Z$. The multiple linear EM actuators comprise at least one multiple-DOF linear actuator but fewer than six linear EM actuators. The at least one multiple-DOF linear actuator can comprise a first actuator portion extending along a first side of the carrier and a second actuator portion extending along a second side of the carrier. In such a configuration, the first and second actuator portions are operable substantially synchronously in at least one of the X, Y, and Z DOFs.

In some embodiments the multiple linear EM actuators comprise at least two multiple-DOF linear actuators. These two EM actuators can provide movability of the carrier in at least four DOFs. A third linear EM actuator can be used to provide movability of the carrier in at least one DOF not provided by the two multiple-DOF linear actuators. In other embodiments the two multiple-DOF linear actuators can comprise a first two-DOF linear motor and a second two-DOF linear motor that collectively provide movability of the carrier in two of X, Y, and Z DOFs and at least two of $\theta_X$, $\theta_Y$, and $\theta_Z$ DOFs. The third linear EM actuator can be a one- or two-DOF linear motor that provides movability of the carrier in the remaining one of the X, Y, or Z DOF not provided by the first and second two-DOF linear motors.

In other embodiments the multiple linear EM actuators comprise at least two two-DOF linear motors. The at least two two-DOF linear motors can comprise a first linear motor providing movement of the carrier in X and Y DOFs and a second linear motor providing movement of the carrier in Y and Z DOFs, wherein the Y DOF represents a long-stroke direction. The first and second linear motors desirably collectively provide movements of the carrier relative to the base in $\theta_X$, $\theta_Y$, and $\theta_Z$ DOFs.

The carrier in these embodiments can be, for example, a reticle carrier such as used in a microlithography system for holding a pattern-defining reticle relative to an optical system.

The stage device can further comprise at least one reaction mass coupled to move, relative to the base, in coordination with the carrier in at least one of the X, Y, and Z DOFs. In such a configuration, one of the X, Y, and Z DOFs can be a long-stroke direction, wherein the at least one reaction mass moves in the long-stroke direction.

A stage device according to another embodiment comprises a carrier and first and second two-DOF linear motors. The carrier (desirably of a "monolithic" configuration as defined herein) has first and second opposing regions. The first two-DOF linear motor is coupled to the first region and provides, when actuated, motion of the carrier relative to a base in two of the X, Y, and Z DOFs. The second two-DOF linear motor is coupled to the second region of the carrier and provides, when actuated in coordination with the first two-DOF linear motor, motion of the carrier relative to the base in two of the X, Y, and Z DOFs. A third linear motor is coupled to the carrier and provides, when actuated, motion of the carrier relative to the base at least in the remaining of the X, Y, and Z DOFs. The first, second, and third linear motors are further configured to provide, when actuated in coordination with each other, motion of the carrier relative to the base in all six DOFs (X, Y, Z, $\theta_X$, $\theta_Y$, $\theta_Z$). The second two-DOF linear motor can provide motion of the carrier relative to the base in the same two of the X, Y, and Z DOFs as the first two-DOF linear motor. For example, the first and second two-DOF linear motors can be configured to provide motion of the carrier in the Z and Y DOFs relative to the base, wherein the third linear motor is a one-DOF linear motor configured to provide motion of the carrier in the X DOF relative to the base. The Y DOF desirably represents a long-stroke direction. The Z and X DOFs can represent short-stroke directions. In some embodiments the first and second two-DOF linear motors additionally provide the motion of the carrier in the $\theta_X$, $\theta_Y$, and $\theta_Z$ DOFs relative to the base.

Particularly if the stage device has a long-stroke direction, the device can further comprise a reaction mass movable in the long-stroke direction in coordination with movement of the carrier relative to the base.

In certain embodiments the first and second two-DOF linear motors each have a moving-magnet configuration in which respective magnet arrays of the first and second two-DOF linear motors are coupled to the carrier. The third linear motor can also have a moving-magnet configuration.

The carrier generally has an obverse surface and a reverse surface. In certain embodiments the first and second two-DOF linear motors each have a respective obverse-surface portion disposed on the obverse surface and a respective reverse-surface portion disposed on the reverse surface.

In many embodiments the carrier is at least partially magnetically levitated relative to the base. The stage device can further comprise a weight compensator including a first portion mounted to the carrier and a second portion coupled to the base. Desirably the first and second portions are magnetically interactive with each other.

In certain embodiments each of the first and second two-DOF linear motors is coupled to a respective reaction mass that moves relative to the base in response to actuation of the respective linear motor. In these and other configurations the base desirably comprises multiple guide members extending parallel to each other. Each reaction mass desirably is configured to slide on a respective guide member.

As in other embodiments summarized above, the stage device can be a reticle carrier such as used in a microlithography system for holding a pattern-defining reticle relative to an optical system.

A stage device according to yet another embodiment comprises a carrier, a first two-DOF linear motor, and a second two-DOF linear motor. The first two-DOF linear motor is coupled to the carrier and provides, when actuated, motion of the carrier relative to a base in two of X, Y, and Z DOFs. The second two-DOF linear motor is coupled to the carrier and provides, when actuated, motion of the carrier relative to the base in two of X, Y, and Z DOFs. One of the X, Y, and Z DOFs of the second two-DOF linear motor is one of the X, Y, and Z DOFs of the first two-DOF linear motor. The first and second linear motors are further configured to provide, when actuated in coordination with each other, motion of the carrier relative to the base in the X, Y, and Z DOFs and respective angular motions of the carrier relative to the base in $\theta_X$, $\theta_Y$, and $\theta_Z$ DOFs. Thus, the carrier is provided with six DOFs of motion relative to the base. The carrier generally has first and second opposing regions extending in a first orthogonal direction, wherein the first and second opposing regions include first and second edges, respectively. The first two-DOF linear motor is coupled to the carrier along the first and second opposing regions, and the second two-DOF linear motor is coupled to the carrier along the first and second edges.

The stage device can be configured such that one of the X, Y, Z DOFs represents a long-stroke direction. In this configuration, the other two of the X, Y, Z DOFs represent respective short-stroke directions. For example, the Y DOF (which is the scanning direction in many reticle stage devices) can represent the long-stroke direction.

As in other embodiments summarized above, the stage device can be a reticle carrier such as used in a microlithography system for holding a pattern-defining reticle relative to an optical system.

According to another aspect, reticle stages are provided. An embodiment of such a stage comprises a monolithic reticle carrier having first and second opposing regions, a first two-DOF linear motor, and a second two-DOF linear motor. The first two-DOF linear motor is coupled to the first region of the carrier and is configured to provide, when actuated, motion of the carrier relative to a base in two of X, Y, and Z DOFs. The second two-DOF linear motor is coupled to the second region of the carrier and is configured to provide, when actuated in coordination with the first two-DOF linear motor, motion of the carrier relative to the base in the two of the X, Y, and Z DOFs. The reticle stage of this embodiment includes a third linear motor coupled to the carrier and configured to provide, when actuated, motion of the carrier relative to the base in the remaining of the X, Y, and Z DOFs. The first, second, and third linear motors desirably are further configured to provide, in coordination with each other, motion of the carrier relative to the base in all six DOFs (X, Y, Z, $\theta_X$, $\theta_Y$, $\theta_Z$). The first and second two-DOF linear motors can be configured to provide motion of the carrier in the Z and Y DOFs relative to the base, wherein the Y DOF represents a long-stroke direction and the Z DOF represents a short-stroke direction. In this embodiment the third linear motor is a one-DOF linear motor configured to provide motion of the carrier in the X DOF relative to the base. The X DOF can represent a short-stroke direction.

Certain embodiments can further comprise at least one reaction mass that is movable in the long-stroke direction in coordination with movement of the carrier relative to the base. In these and other embodiments the base can comprise at least one guide member, wherein the at least one reaction mass is mounted to a respective guide member via at least one respective bearing. The bearing can be a gas bearing.

In certain embodiments the first and second two-DOF linear motors each have a moving-magnet configuration in which respective magnet arrays of the first and second two-DOF linear motors are coupled to the carrier. The third linear motor desirably also has a moving-magnet configuration.

The carrier generally has an obverse surface and a reverse surface. In certain embodiments the first and second two-DOF linear motors each have a respective obverse-surface portion disposed on the obverse surface and a respective reverse-surface portion disposed on the reverse surface.

The reticle stage desirably is at least partially magnetically levitated relative to the base. The reticle stage can further comprise a weight compensator that includes a first portion mounted to the carrier and a second portion coupled to the base. The first and second portions desirably are magnetically interactive with each other.

Yet another embodiment of a reticle stage comprises a monolithic reticle carrier, a first two-DOF linear motor, and a second two-DOF linear motor. The first two-DOF linear motor is coupled to the carrier and is configured to provide, when actuated, motion of the carrier relative to a base in X and Y DOFs. The second two-DOF linear motor is coupled to the carrier and is configured to provide, when actuated, motion of the carrier relative to the base in Y and Z DOFs. The first and second linear motors are further configured to provide, when actuated in coordination with each other, motion of the carrier relative to the base in the X, Y, and Z DOFs and respective angular motions of the carrier relative to the base in $\theta_X$, $\theta_Y$, and $\theta_Z$ DOFs. Thus, the carrier is provided with six DOFs of motion relative to the base. The carrier generally has first and second opposing regions extending in a first orthogonal direction, wherein the first and second opposing regions include first and second edges, respectively. The first two-DOF linear motor can be coupled to the carrier along the first and second opposing regions, and the second two-DOF linear motor can be coupled to the carrier along the first and second edges. Desirably, the reticle stage has at least one long-stroke direction, such as represented by the Y DOF. Especially if the stage has a long-stroke direction, the reticle stage desirably has at least one reaction mass that is movable in the long-stroke direction in coordination with movement of the carrier relative to the base. If the base comprises at least one guide member, then the at least one reaction mass is mounted to a respective guide member via at least one respective bearing (e.g., a gas bearing).

In some embodiments the first and second two-DOF linear motors each have a moving-magnet configuration in which respective magnet arrays of the first and second two-DOF linear motors are coupled to the carrier.

The carrier desirably is at least partially magnetically levitated relative to the base. This and other embodiments can include a weight compensator including a first portion mounted to the carrier and a second portion coupled to the base, wherein the first and second portions are magnetically interactive with each other.

According to yet another aspect, microlithography systems are provided. Various embodiments of such a system comprise a substrate stage, an optical system disposed relative to the substrate stage, and a reticle stage according to any of the embodiments summarized above or described herein. The reticle stage is disposed relative to the optical system.

The foregoing and additional features and advantages of the invention will be more readily apparent from the following detailed description, which proceeds with reference to the accompanying drawings.

DETAILED DESCRIPTION

Figure 1:
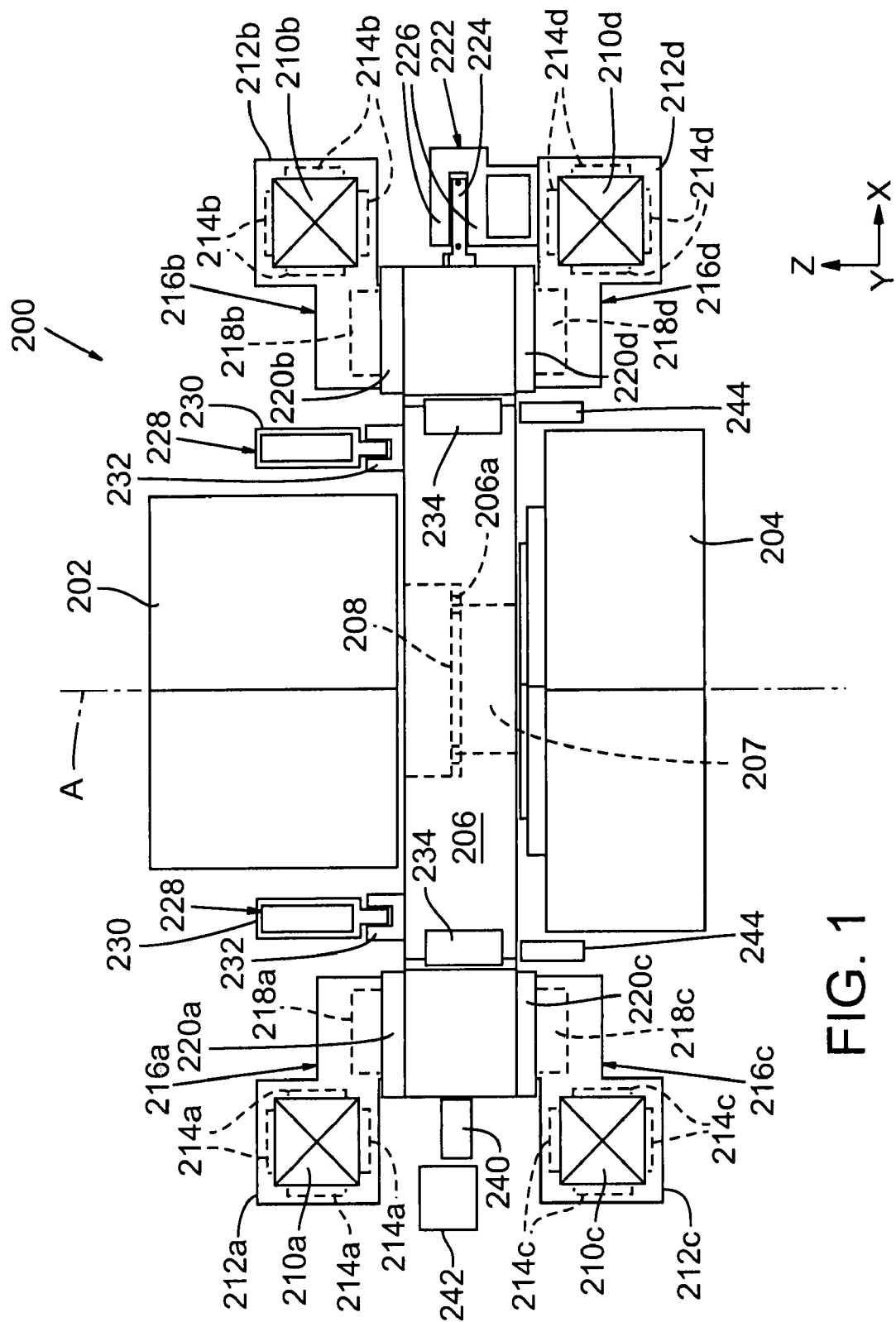
FIG. 1 is an elevational view of a stage device according to a first representative embodiment.

As used in this application and in the claims, the singular forms "a," "an," and "the" include the plural forms unless the context clearly dictates otherwise. Additionally, the term "includes" means "comprises." Further, the term "coupled" means electrically, electromagnetically, or optically coupled or linked, as applicable, and does not exclude the presence of intermediate elements between the coupled items.

The described devices and methods described herein should not be construed as being limiting in any way. Instead, this disclosure is directed toward all novel and non-obvious features and aspects of the various disclosed embodiments, alone and in various combinations and sub-combinations with one another. The disclosed devices and methods are not limited to any specific aspect or feature or combinations thereof, nor do the disclosed devices and methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed things and methods can be used in conjunction with other things and method. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In the following description, certain terms may be used such as "up," "down,", "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

A stage device as discussed below is generally a device configured to hold and move an object mounted or placed on a movable part of the stage device. The motion provided by the stage device is typically relative, directly or indirectly, to a stationary structure such as a floor, a frame, or a support to which the stage device is mounted. The object can be a reticle or a substrate, as discussed earlier above, or any of various other workpieces, specimens, or things. Stage devices, including devices as described below, are not limited to use in microlithography systems, but rather can be used in any of various settings and applications. For example, certain embodiments can be used for positioning a workpiece relative to a machining tool or processing tool or for positioning a specimen relative to an inspection tool, imaging tool (e.g., microscope), or other optical system. In view of the various things can be held and moved using a stage device, it will be understood that the movable part ("carrier") of the stage device is not limited to a platform or a part of a platform. If the carrier is a platform per se, it need not be planar or continuously planar; in various embodiments the platform can have any of various voids or features that facilitate its intended use for holding the object, allowing light or other transmitted energy to interact with the object, etc. The carrier can be configured to accept a "chuck" or the like by which the thing is mounted to or placed on the carrier.

In configuring at least certain embodiments of the instant stage devices, several considerations were made: (1) The stage device should be capable of exhibiting all six degrees of freedom (DOF) of motion, namely X, Y, Z, $\theta_X$, $\theta_Y$, and $\theta_Z$ motion. (2) The stage device should be magnetically levitated. (3) The stage device should be "monolithic," by which is meant that a single carrier is provided with all six DOFs of motion without having to be configured as two separate carriers, such as a coarse stage plus fine stage. (3) The actuators should all be linear motors, wherein at least some (desirably most, and in some embodiments, all) of the linear motors are two-DOF linear motors. A "two-DOF" linear motor is a linear motor configured to provide motion in two DOFs, e.g., motion in the Y-direction and in the Z-direction. (4) The stage device should be adaptable (e.g., by increasing or decreasing its size) for various sizes of objects to be held by the carrier. (5) The stage device should include reaction masses associated with the movements of the carrier in at least one DOF (e.g., the long-stroke direction). (6) The stage device should be adaptable for different ranges of motion, depending upon the DOF of motion (e.g., long stroke in the Y-direction, short stroke in the X-direction, short strokes or ranges of motion in each of the Z, $\theta_X$, $\theta_Y$, $\theta_Z$ directions). In certain embodiments the stage device allows interferometric monitoring of position of the carrier in a manner that minimizes or eliminates interferometer-beam passage through heat-generating portions of the stage device (such as parts of the linear motors). Heat-generating portions of the stage device cause localized heating of the surrounding atmosphere, which produces regions of localized turbulence and altered index of refraction relative to other portions of the interferometer-beam path. Passing an interferometer beam through such a temperature-perturbed region (even if the temperature difference is only slight) can cause appreciable measurement errors.

In certain embodiments the linear motors are configured in a "moving-magnet" rather than in a "moving-coil" manner. A moving-magnet configuration avoids or at least minimizes having to accommodate moving wires and the like on the carrier (which can apply moments to the carrier and produce other undesirable phenomena that degrade performance of the stage device). Rather, the wiring and cooling are associated with the reaction masses.

In certain embodiments, with respect to the magnetic levitation, the stage device includes weight compensation. Benefits of such a configuration include off-loading at least a portion of the weight of the carrier.

In certain embodiments, magnet mass is well-distributed among the various linear motors. In certain embodiments linear motors with cantilevered appendages are avoided. These embodiments produce improved balance and reduced moments.

For use as a reticle-stage device, example guidelines included plan dimensions of approximately 400-mm square (i.e., approximately 400 mm in each of the X and Y directions); approximately 100-mm thick in the region that would be situated just downstream of the illumination-optical system; approximately 200-mm thick at the reaction masses and linear motors; and a total mass of approximately 20 Kg.

First Representative Embodiment

This embodiment is directed to a stage device comprising four two-DOF linear motors (collectively providing motion in the Y, Z, $\theta_X$, $\theta_Y$, and $\theta_Z$ directions) and one one-DOF linear motor (providing motion in the X-direction). The stage device also includes weight compensation and multiple interferometers for monitoring positions and motions in each of the Z-direction, Y-direction, and Z-direction. This particular embodiment is described and depicted in the context of the stage device being a reticle-stage device for used in a projection-microlithography system that utilizes a transmissive reticle. But, it will be understood that this particular context is not intended to be limiting. In the following description, reference is made as appropriate to FIGS. 1-3.

FIG. 1 provides an elevational view (in the Z-X plane) of the stage device 200, showing at least some of the features noted above. Also visible are a portion of the illumination-optical system 202 and a portion of the imaging-optical system 204. The illumination-optical system 202 and imaging-optical system 204 are situated along and aligned with an optical axis A. The stage device 200 includes a moving member that is called herein a "carrier" 206. The carrier 206 has a platform-like configuration in this embodiment. But, this configuration is not intended to be limiting; as discussed above, the carrier can have any of various other configurations as required or desired. The carrier 206, during use of the stage device 200, is situated, at least part of the time, between the illumination-optical system 202 and imaging-optical system 204. FIG. 1 also depicts the reticle 208 situated on a surface 206a of the carrier 206. The carrier 206 defines a void 207 through which light can pass from the reticle 208 to the downstream imaging-optical system 204. The carrier 206 is part of a "moving assembly" 205 that is shown best in FIG. 3.

Figure 2:
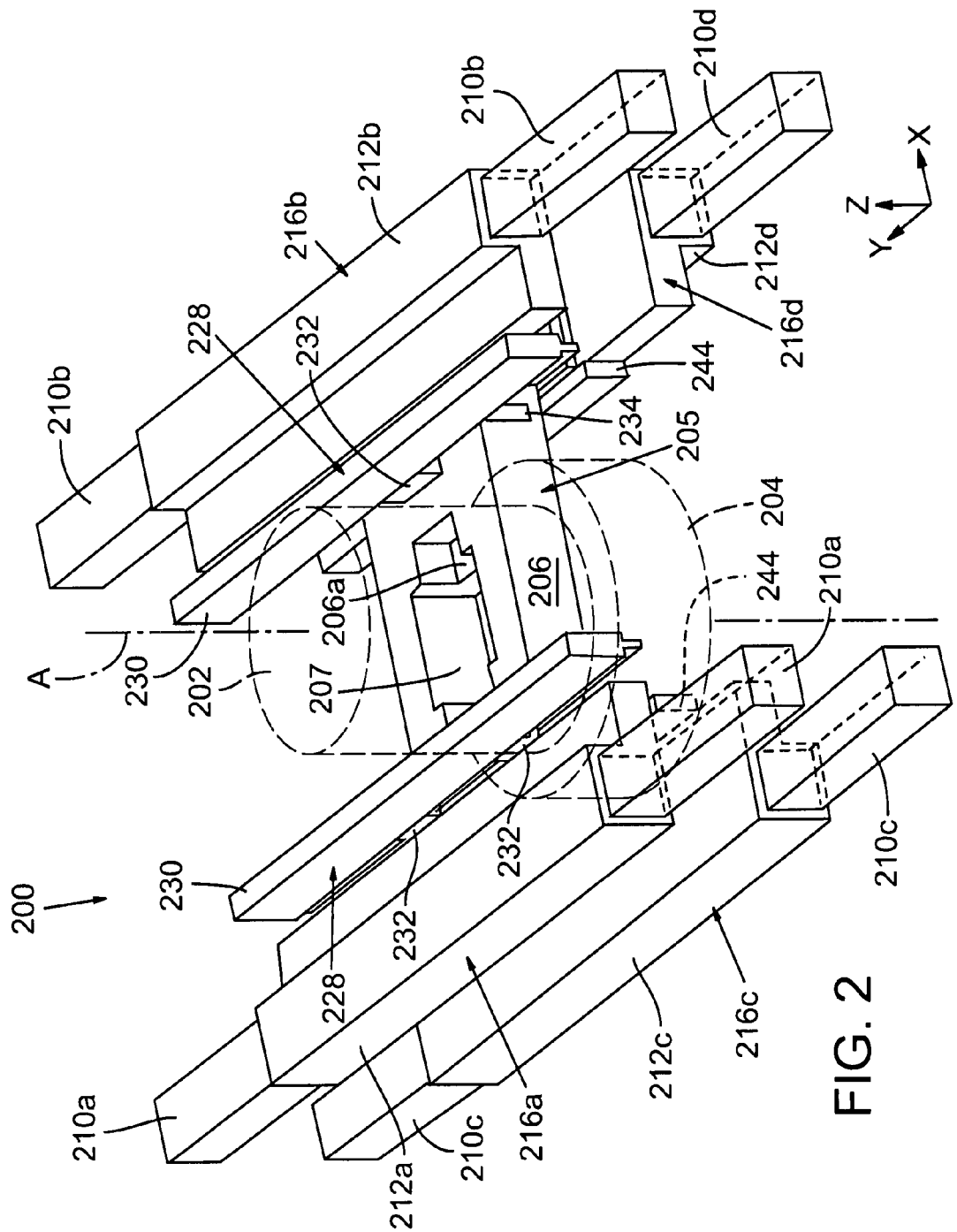
FIG. 2 is a perspective view of the stage device of FIG. 1, also depicting the guide members.

Turning to FIG. 2, the stage device 200 is supported on, and moves relative to, guide members 210a-210d that are mounted to a stationary frame, base, or the like (not shown) of the microlithography system. Hence, the guide members 210a-210d are stationary, and substantially all motions of the carrier 206 (and reticle 208 carried thereby) and other portions of the stage device 200 are relative to the guide members. The guide members 210a-210-d desirably are mounted to the stationary frame or the like in a vibration-damping or vibration-isolation manner to prevent vibrations from propagating from the frame to the stage device 200 and vice versa. Thus, the guide members 210a-210d are analogous to a "base" relative to which the carrier 206 moves.

Mounted to each guide member 210a-210d is a respective reaction mass 212a-212d that is configured to slide along the guide member. For substantially contact-less (and hence substantially frictionless) gliding of the reaction masses 212a-212d along the respective guide members 210a-210d, air bearings 214a-214d are provided on the inside-facing surfaces of the reaction masses facing the guide members. (The air bearings 214a are associated with the reaction mass 212a, and the air bearings 214b-214d are associated with the reaction masses 212b-212d, respectively.)

The reaction masses 212a-212d are respective portions of four linear motors 216a-216d of the stage device 200. Each linear motor 216a-216d is a two-DOF linear motor capable of moving in the Y-direction, which is the "long-stroke" direction of this embodiment, and in the Z-direction. Thus, the linear motors 216a-216d are configured to move the carrier 206 in any resultant direction of the Y and Z orthogonal directions. The range of motion in the Z-direction is typically much less than the range of motion in the Y-direction. For achieving the motion, each linear motor 216a-216d comprises a respective coil assembly 218a-218d and a respective permanent-magnet array 220a-220d situated in close, but non-contacting, opposition to each other.

The permanent-magnet arrays 220a-220d in this embodiment are mounted to the carrier 206 and hence move along with motion of the moving assembly 205. The magnet arrays 220a, 220c are on one region (left-hand region in the figure) of the carrier 206, and the magnet arrays 220b, 220d are on an opposing region (right-hand region in the figure) of the carrier 206. The magnet arrays 220a, 220b are on an obverse surface of the carrier, and the magnet arrays 220c, 220d are on a reverse surface of the carrier. This configuration of linear motors, in which a magnet array is on a moving member (here the carrier 206), is called a "moving-magnet" configuration, in contrast to a "moving-coil" configuration in which the coil assemblies 218a-218d are mounted to the carrier 206. Electrical actuation of the coil assemblies 218a-218b generates forces interacting between the coil assemblies and the permanent-magnet arrays 220a-220d. These forces cause relative motions of the reaction masses 212a-212d and the carrier 206 according to Newton's third law. For example, in the long-stroke direction (Y-direction in this embodiment), and referring to FIG. 1, movement of the carrier 206 out of the plane of the paper is accompanied by simultaneous motion of the reaction masses 212a-212d (riding on their respective guide members 210a, 210d) into the plane of the paper. If the collective movable mass of the reaction masses 212a-212d is greater than the movable mass of the carrier 206 (which is usually the case), then in the Y-direction, for example, the reaction masses move a shorter distance than the length of motion of the carrier 206. The respective directions of these motions are in opposite directions.

In view of the above, the permanent-magnet arrays 220a-220d desirably are mounted to the carrier 206 rather than to the reaction masses 212a-212d. Actuation of the linear motors 216a-216d requires delivery of electrical power to the coil assemblies 218a-218d, which involves routing of wiring to them. Also, in many embodiments, the coil assemblies 218a-218d are liquid-cooled, which involves routing of coolant conduits to them. Routing electrical wiring and coolant conduits to a moving object requires that the wiring and conduits be configured with "service loops" or the like to maintain delivery of power and coolant to the object during motion of, and at different positions of, the object. Since the reaction masses 212a-212d typically move less distance than the carrier 206, mounting the coil assemblies 218a-218d on the reaction masses rather than on the carrier minimizes the length and mass of service loops of electrical wiring and coolant conduits coupled to the linear motors. The reaction masses 218a-218d also move at a lower velocity than the carrier 206, which reduces cable-generated vibrations. This configuration also prevents the carrier 206 having to "carry" wiring and coolant conduits along as it moves, which avoids imposing moments and/or other undesirable stresses to carrier motion. Also, the shorter service loops of wiring and conduits to the reaction masses are less prone to reliability problems than longer loops would be.

This embodiment also includes an X-direction linear motor 222 that is a short-stroke linear motor in this embodiment. This linear motor 222 is substantially a one-DOF motor, providing motion of the carrier 206 in the X-direction. The linear motor 222 comprises a permanent-magnet array 224, extending substantially in the X-Y plane, and coil arrays 226. In this embodiment the permanent-magnet array 224 is mounted to the carrier 206, in a "moving magnet" manner. The benefits of a moving-magnet configuration for this linear motor 222 are similar to those discussed above.

As noted above, each of the linear motors 216a-216d is a two-DOF linear motor. In this embodiment, each of these linear motors can undergo motion not only in the Y-direction but also in the Z-direction and in any resultant of these directions. By electrically actuating the coil assemblies 218a-218d in substantially the same way for Z-direction motion, all four motors 216a-216d impart substantially equal upward or downward force to the carrier 206. The coil assemblies 218a-218d also can be differentially actuated to achieve tilts ($\theta_X$-and $\theta_Y$-motions) of the carrier. In addition, the linear motors 216a-216d can be differentially actuated to achieve yaw ($\theta_Z$ motion) of the carrier 206 about the axis A. Hence, in this embodiment the four linear motors 216a-216d collectively provide five DOFs of motion to the carrier 206: Y, Z, $\theta_X$, $\theta_Y$, $\theta_Z$, and the linear motor 222 provides one DOF of motion: X. As a result, the carrier 206 is provided with all six DOFs of motion relative to the guide members 210a-210d.

The coil assemblies 218a-218d, 226 include one or more respective windings of electrical conductor such as wire. In linear motors, the windings can have any of several configurations such as, but not limited to, lap-wound and Gramme-wound configurations. The windings also can be of a "split-coil" configuration. Split-coil is a type of lap-wound coil assembly, and incorporates two or more independently powered resistive paths. The non-split coil assembly has a single, independently powered resistive path.

Passage of electrical current through the coil windings generates heat. In some embodiments heat can be removed passively such as by simple conduction to adjoining structure. But, in other embodiments, especially embodiments used in microlithography systems, it may be advantageous or necessary to cool the coil assemblies in an active manner, such as by circulating a liquid coolant through channels associated with the coil assemblies. Not all the coil assemblies of a particular stage device need be cooled or cooled in the same manner.

The linear motors 216a-216d, 222 provide magnetic levitation for the carrier 206 and other parts of the stage device 200. Among various benefits, the magnetic levitations provide substantially friction-less bearings for movements imparted by the motors 216a-216d, 222. The stage device 200 in this embodiment also includes weight compensators 228 that help support the weight of the moving assembly 205. The weight compensators 228 desirably are of a permanent-magnet configuration that operates by magnetic levitational force. They desirably also are long-travel (in the Y long-stroke direction) and low in stiffness. The weight compensators 228 compensate for force on the carrier 206 due to gravity by applying forces (e.g., magnetic forces) that counter the gravitational downward force. In the depicted embodiment each weight compensator 228 comprises a stationary member 230 and at least one respective moving member 232. Each of the members 230, 232 comprises respective arrays of permanent magnets that operate and interact continuously with each other, which provides substantial benefit in retaining magnetic levitation of the carrier at times when the linear motors 216a-216d, 222 are not moving.

It will be understood that the weight compensators 228 could be omitted in certain embodiments simply by increasing the power applied to the linear motors. However, this alternative tends to increase power consumption and heat production by the linear motors, which may not be desirable in some applications.

Figure 3:
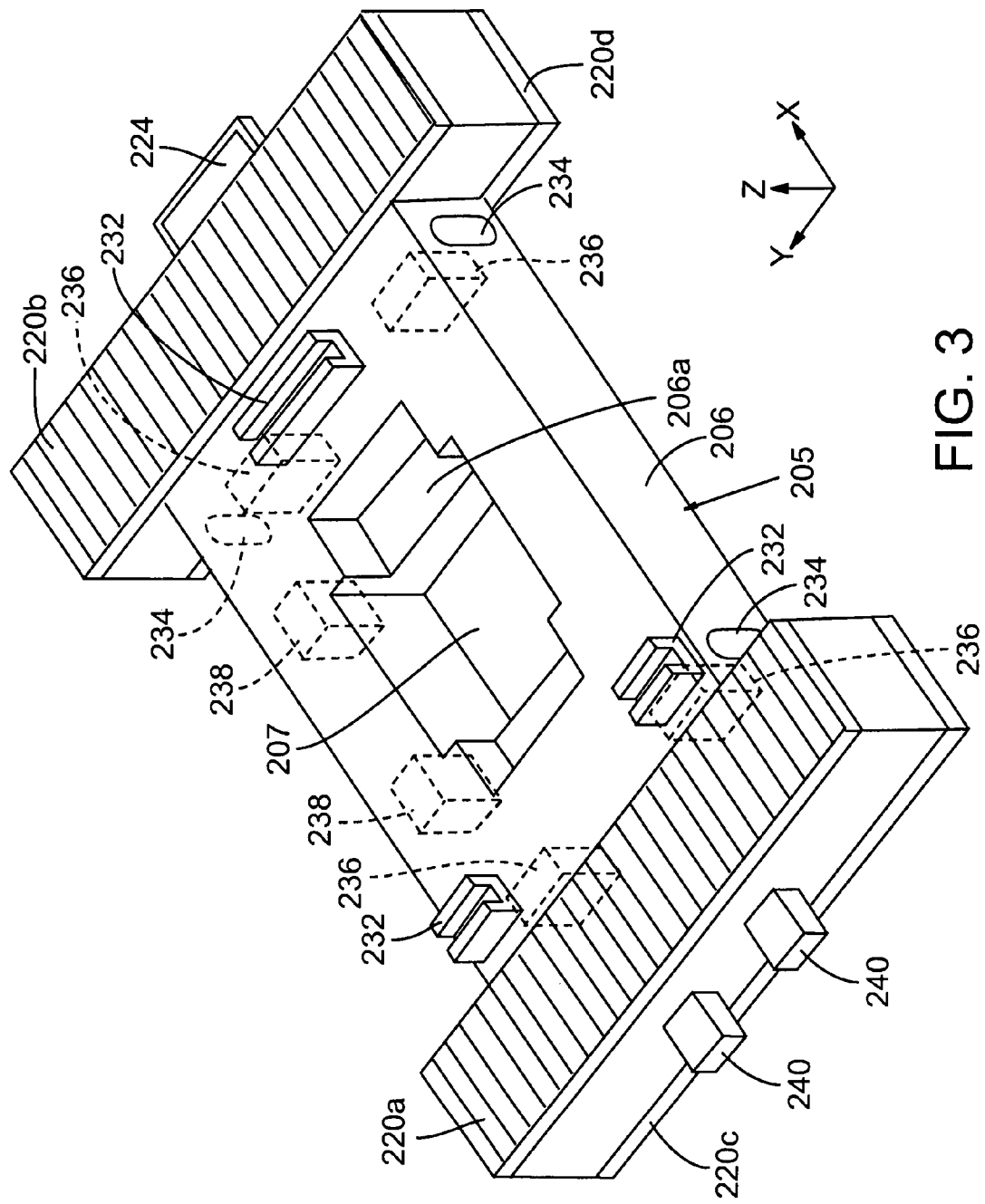
FIG. 3 is a perspective view of the moving assembly of the stage device of FIG. 1.

Position of the carrier 206 is determined interferometrically, so the stage device 200 is provided with multiple interferometers to determine carrier position in all of the six DOFs. To such end, this embodiment comprises at least three (desirably four) Z-interferometers, two X-interferometers, and two Y-interferometers. It will be understood that these numbers of interferometers are not intended to be limiting in any way, but rather are stated by way of example. This embodiment is particularly advantageous because it allows the interferometers to direct their respective beams to the carrier 206 in the plane of the reticle 208. Certain of the interferometers (or portions thereof) are shown in the figures. FIG. 1 shows entry ports 234 for three of the four Z-interferometers 236. FIG. 3 also shows exemplary locations of the two Y-interferometers 238, and of the two X-interferometers 240. Shown in FIG. 1 is a bar mirror 242 for the X-interferometers 240 and bar mirrors 244 for the Z-interferometer. In this embodiment, the bar mirrors 242, 244 are stationary and are mounted to the imaging-optical system 204 (coupling not shown).

In this and various other embodiments, the interferometers can be of a fixed-mirror type and/or of a moving-mirror type, by which is meant that the respective mirror utilized by the subject interferometer is stationary or moves, respectively. Not all the interferometers need be the same type; both types or one type can be used on a given stage device. Moving-mirror arrangements are often used for monitoring over a long range of movement, such as the Y-direction. Fixed-mirror arrangements are often used for monitoring over a shorter range of movement, such as the X- and Z-directions. Hence, in the embodiment of FIG. 1, the Z-interferometers 236 are fixed-mirror types (using the bar mirrors 244), and the X-interferometers 240 are fixed-mirror types (using the bar mirror 242). The Y-interferometers 238 are moving-mirror types.

In this embodiment as shown in FIG. 3, the moving assembly 205 comprises the carrier 206, the permanent-magnet arrays 210a-210d, the moving members 232 of the weight compensators, at least a portion of the Z-interferometers 236, at least a portion of the Y-interferometers 238, and at least a portion of the X-interferometers 240.

This embodiment is advantageous because the gaps between magnet arrays and coil assemblies in the linear motors can be kept very small without allowing the magnet arrays and coil assemblies to make actual contact with each other.

This embodiment also is advantageous because interferometric monitoring of position of the carrier 206 is performed in a manner that avoids having to pass any of the interferometer beams through any portions of the linear motors. In addition, the respective beams of the X, Y, and Z interferometers interact with the carrier 206 substantially within the plane of the reticle 208.

This embodiment also is advantageous because, as the pairs of Y-Z linear motors 216a and 216c, 216b and 216d are actuated to move the carrier 206, the motive force applied to the carrier by the motors is substantially applied to the center of gravity (CG) of the carrier. For example, in the long-stroke (Y) direction, the linear motors 216a-216d apply their respective forces collectively in the reticle plane, which includes the CG of the carrier 206. This manner of applying motive force to the carrier 206 provides greater efficiency and avoids unwanted movements, moments, vibrations, carrier deformations, and other faults that otherwise could accompany movement of the carrier. Even though FIG. 1 depicts a bilaterally symmetrical arrangement of the linear motors 216a-216d about the reticle plane, an alternative embodiment could have one pair of linear motors (e.g., 216a and 216c) that are bilaterally symmetrical about the reticle plane as shown and the other pair (216b, 216d) that are not bilaterally symmetrical or in a different bilaterally symmetrical relationship. The arrangement shown in FIG. 1 in which all the linear motors 216a-216d are in a symmetrical relationship is most desired.

In this embodiment the Y,Z linear motors 216a, 216c on one side of the carrier 206 can be regarded as a "single" linear motor that has been longitudinally split into an upper half 216a and a lower half 216c. Similarly, the Y,Z linear motors 216b, 216d on the other side of the carrier 206 can be regarded as a "single" linear motor that has been longitudinally split into an upper half 216b and a lower half 216d. It is also possible to regard all the Y,Z linear motors 216a-216d as a "single" linear motor that has been longitudinally split into four portions.

Second Representative Embodiment

This embodiment is directed to a stage device comprising four two-DOF linear motors (collectively providing motion in the Y, Z, $\theta_X$, $\theta_Y$, and $\theta_Z$ directions) and one one-DOF linear motor (providing motion in the X-direction). The stage device also includes weight compensation and multiple interferometers for monitoring positions and motions in each of the Z-direction, Y-direction, and Z-direction. This particular embodiment is described and depicted in the context of the stage device being a reticle-stage device for used in a projection-microlithography system that utilizes a transmissive reticle. But, it will be understood that this particular context is not intended to be limiting. In the following description, reference is made as appropriate to FIGS. 4(A)-4(B) and 5.

Figure 4A:
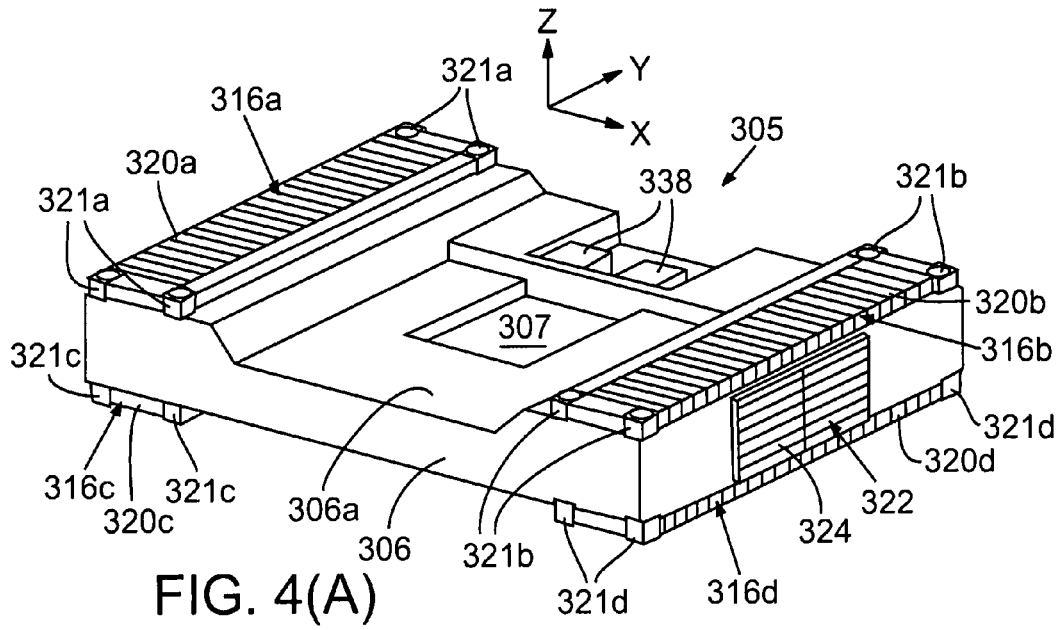
FIGS. 4(A)-4(B) are perspective views (180° rotated) of the moving assembly of a stage device according to a second representative embodiment.
Figure 4B:
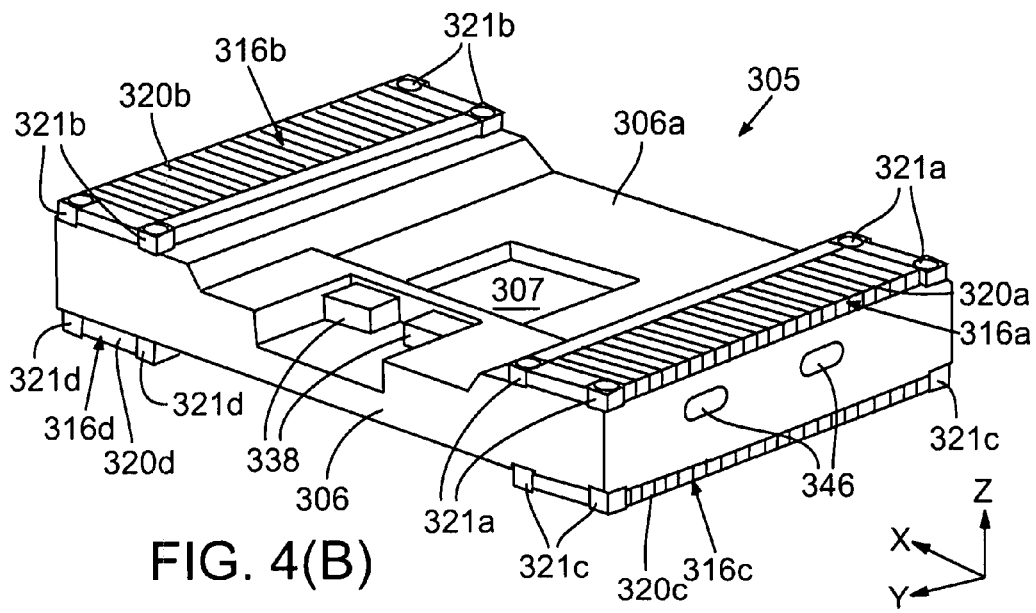
Figure 5:
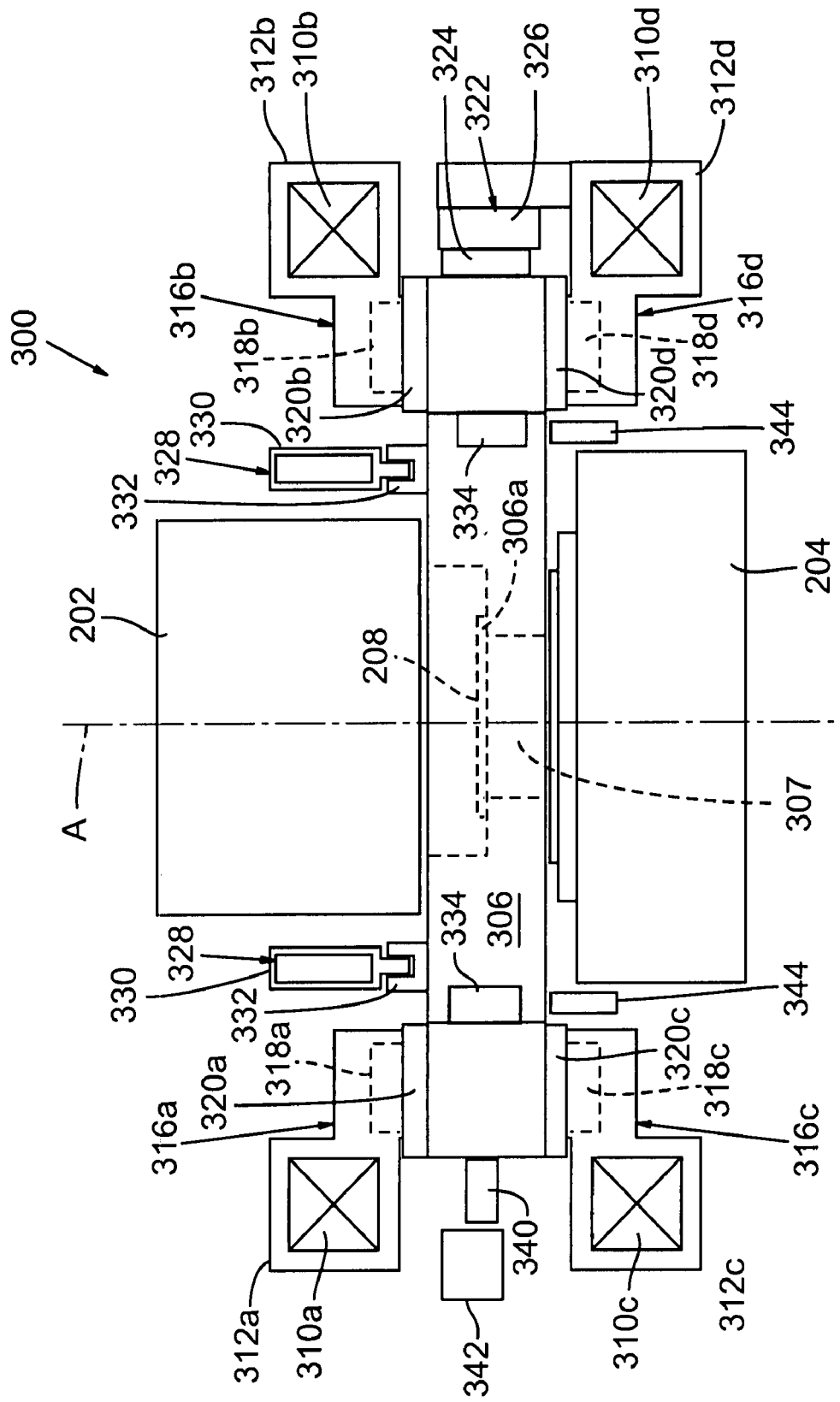
FIG. 5 is an elevational view of the stage device according to the second representative embodiment.

FIG. 5 provides an elevational view (in the Z-X plane) of the stage device 300, showing at least some of the features noted above. Also visible are a portion of the illumination-optical system 202 and a portion of the imaging-optical system 204. The illumination-optical system 202 and imaging-optical system 204 are situated along and aligned with an optical axis A. The stage device 300 includes a moving carrier 306 having a platform-like configuration (as in the first embodiment, but not intended to be limiting with respect to configuration). The carrier 306, during use of the stage device 300, is situated, at least part of the time, between the illumination-optical system 202 and imaging-optical system 204. FIG. 5 also depicts the reticle 208 situated on a surface 306a of the carrier 306. The carrier 306 defines a void 307 through which light can pass from the reticle 208 to the downstream imaging-optical system 204. The carrier 306 is part of a "moving assembly" 305 that is shown best in FIGS. 4(A)-4(B).

As in the first embodiment, the stage device 300 is supported on, and moves relative to, guide members 310a-310d that are mounted to a stationary frame, base, or the like (not shown). Hence, the guide members 310a-310d are stationary, and substantially all motions of the carrier 306 (and reticle 208 carried thereby) and other portions of the stage device 300 are relative to the guide members. The guide members 310a-310d desirably are mounted to the stationary frame or the like in a vibration-damping or vibration-isolation manner to prevent vibrations from propagating from the frame to the stage device 300 and vice versa.

Mounted to each guide member 310a-310d is a respective reaction mass 312a-312d that is configured to slide along the guide member. For substantially contact-less (and hence substantially frictionless) gliding of the reaction masses 312a-312d along the respective guide members 310a-310d, air bearings are provided (but not shown, since understood from FIG. 1) on the inside-facing surfaces of the reaction masses facing the guide members.

The reaction masses 312a-312d are respective portions of four linear motors 316a-316d of the stage device 300. Each linear motor 316a-316d is a two-DOF linear motor capable of moving in the Y-direction, which is the "long-stroke" direction of this embodiment, and in the Z-direction. The range of motion in the Z-direction is typically much less than the range of motion in the Y-direction. For achieving the motion, each linear motor 316a-316d comprises a respective coil assembly 318a-318d and a respective permanent-magnet array 320a-320d situated in close, but non-contacting, opposition to each other.

The permanent-magnet arrays 320a-320d in this embodiment are mounted to the carrier 306 and hence move along with motion of the moving assembly 305. This configuration of linear motors is called a "moving-magnet" configuration, as noted above. Electrical actuation of the coil assemblies 318a-318b generates forces interacting between the coil assemblies and the permanent-magnet arrays 320a-320d. These forces cause relative motions of the reaction masses 312a-312d and the carrier 306 according to Newton's third law, as discussed in the first embodiment.

As will be appreciated from the foregoing, this embodiment is similar in many ways to the first representative embodiment. The difference resides principally in the moving assembly 305, specifically with respect to the X-direction linear motor. To supplement what is shown in FIG. 5, certain features of the moving assembly 305 are depicted in FIGS. 4(A)-4(B), which depict mutually opposing orientations thereof.

Visible in FIGS. 4(A)-4(B), are the surface 306a on which a reticle (not shown but see FIG. 5) rests during use, and the void 307 through which light can pass from the reticle to a downstream imaging-optical system (not shown). Also visible are the four permanent-magnet arrays 320a-320d extending in the Y-direction, similar to corresponding magnet arrays 220a-220d in the first representative embodiment. The four two-DOF linear motors 316a-316d collectively provide motions of the carrier 306 in the following DOFs: Y, Z, $\theta_X$, $\theta_Y$, $\theta_Z$. As in the first embodiment, the Y-direction is the long-stroke direction, and the others are short-stroke directions.

This embodiment also includes an X-direction linear motor 322 that is a short-stroke linear motor. The linear motor 322 is substantially a one-DOF motor, providing motion of the carrier 306 in the X-direction. This embodiment differs from the first representative embodiment in that the X-direction linear motor 322 has a different configuration than the X-direction linear motor 212 used in the first representative embodiment. Specifically, the X-direction linear motor 322 includes a permanent-magnet array 324 that is substantially in the Z-Y plane rather than substantially in the X-Y plane. Opposing the magnet array 324 is a coil assembly 326 that is mounted to the reaction mass 312d. Thus, in this embodiment, the permanent-magnet array 324 is mounted to the carrier 306 in a "moving magnet" manner. An advantage of the configuration of X-direction linear motor 322 is that the coils in the coil assembly 326 are arranged to generate X-direction force at any Y-position of the carrier 306. Also, whereas the X-direction linear motor 222 in the first embodiment is cantilevered from the carrier 206, the X-direction linear motor 322 in the second embodiment is not cantilevered and hence has a more rigid structure.

As in the first embodiment the linear motors 316a-316d, 322 provide magnetic levitation for the carrier 306 and other parts of the stage device 300. The magnetic levitations provide, inter alia, substantially friction-less bearings for movements imparted by the motors 316a-316d, 322. The stage device 300 also includes weight compensators 328 that help support the weight of the carrier 306, desirably in a magnetically levitated manner, as in the first embodiment. Each weight compensator 328 comprises a stationary member 330 and at least one respective moving member 332. Position of the carrier 306 is determined interferometrically as in the first embodiment. To such end the stage device 300 is provided with multiple interferometers to determine carrier position in all of the six DOFs. To such end, this embodiment comprises four Z-interferometers, two X-interferometers, and two Y-interferometers. (It will be understood that these numbers of interferometers are not intended to be limiting in any way, but rather are stated by way of example.) As the first embodiment, this embodiment is advantageous because it allows all the interferometers to direct their respective beams in the plane of the reticle 208.

Certain of the interferometers (or portions thereof) are shown in the figures. FIG. 4(B) shows the two Y-interferometers 338 and entry ports 346 for the beams of the X-interferometers 340. Shown in FIG. 5 is a bar mirror 342 for the X-interferometers 340 and bar mirrors 344 for the Z-interferometers. In this embodiment, the bar mirrors 342, 344 are stationary and are mounted to the imaging-optical system 204 (coupling not shown).

Referring to FIGS. 4(A)-4(B), each of the permanent-magnet arrays 320a-320d in this embodiment is mounted to the carrier 306 via respective kinematic flexures 321a-321d each providing one DOF of motion. The kinematic flexures 321a-321d minimize carrier distortion that otherwise may arise from the switching on and off of magnet forces on individual magnets. A similar feature (although not detailed) can be provided on the permanent-magnet arrays 220a-220d in the first embodiment.

This embodiment is advantageous because the gaps between magnet arrays and coil assemblies in the linear motors can be kept very small without allowing the magnet arrays and coil assemblies to make actual contact with each other.

This embodiment also is advantageous because interferometric monitoring of position of the carrier is performed in a manner that avoids passage of interferometer beams through any portions of the linear motors. In addition, the respective beams of the X, Y, and Z interferometers interact with the carrier substantially within the plane of the reticle.

Third Representative Embodiment

A stage device 400 according to this embodiment comprises four two-DOF linear motors (collectively providing motion in all six DOFs: Z, Y, Z, $\theta_X$, $\theta_Y$, $\theta_Z$). The stage device 400 also includes weight compensation and multiple interferometers for monitoring positions and motions of a carrier in each of the Z-direction, Y-direction, and Z-direction. In the following description, reference is made as appropriate to FIGS. 6 and 7.

Figure 6:
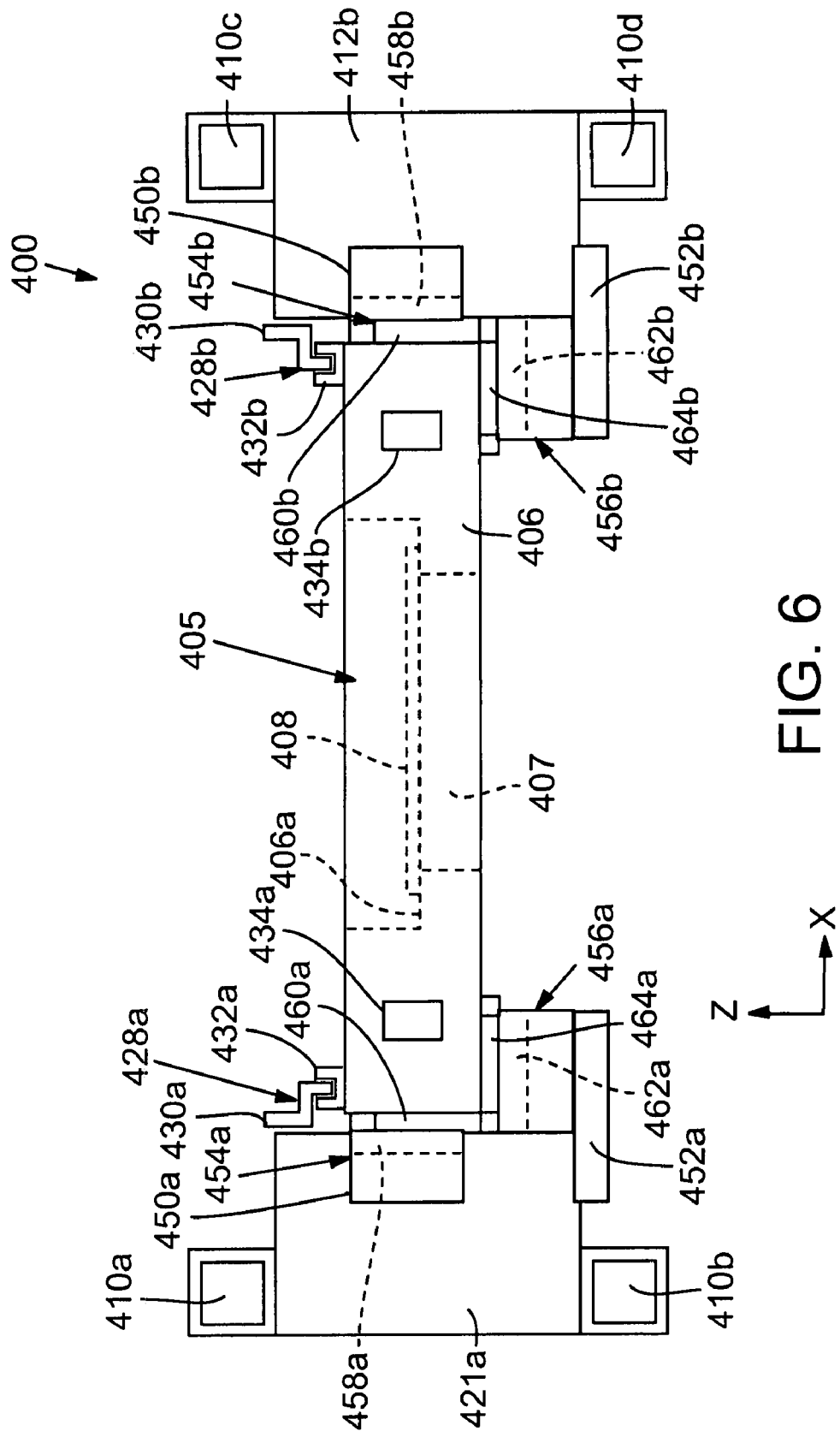
FIG. 6 is an elevational view of a stage device according to a third representative embodiment.
Figure 7:
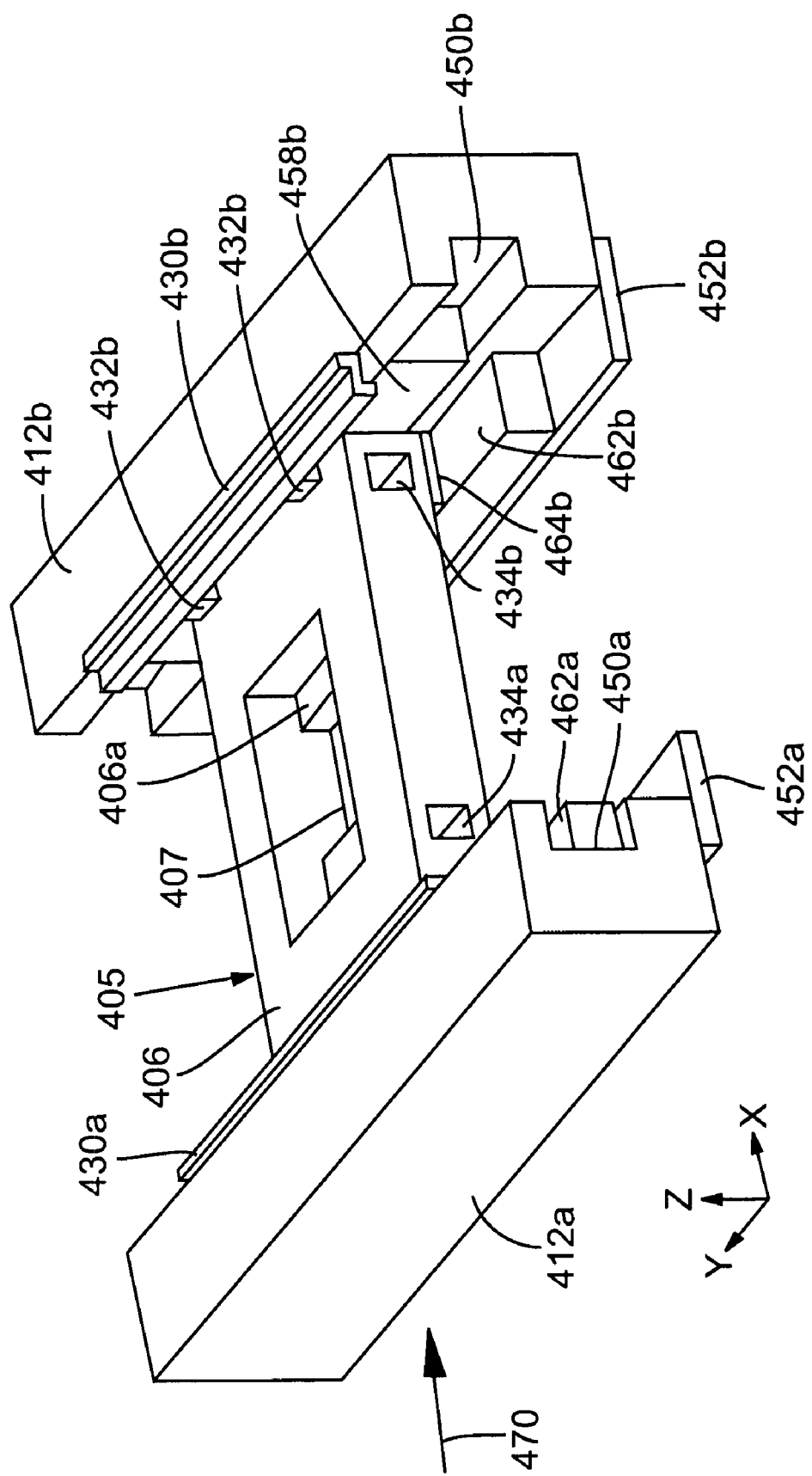
FIG. 7 is a perspective view of a portion of the stage device of FIG. 6.

FIG. 6 provides an elevational view (in the Z-X plane) of the stage device 400. Although not shown, this embodiment used as a reticle stage usually would be situated between an illumination-optical system and an imaging-optical system. The stage device 400 includes a moving carrier 406 having a platform-like configuration (as in the first and second embodiments, the platform-like configuration is not intended to be limiting). FIG. 6 also depicts the reticle 408 situated on a surface 406a of the carrier 406. The carrier 406 defines a void 407 through which light can pass from the reticle 408 to downstream components. The carrier 406 is part of a "moving assembly" 405.

As in the first embodiment, the stage device 400 is supported on, and moves relative to, guide members 410a-410d that are mounted to a stationary frame, base, or the like (not shown). Hence, the guide members 410a-410d are stationary, and substantially all motions of the carrier 406 (and reticle 408 carried thereby) and other portions of the stage device 400 are relative to the guide members. The guide members 410a-410d desirably are mounted to the stationary frame or the like in a vibration-damping or vibration-isolation manner to prevent vibrations from propagating from the frame to the stage device 400 and vice versa.

Mounted to one pair of guide members 410a, 410b is a respective reaction mass 412a, and mounted to the other pair of guide members 410c, 410d is a respective reaction mass 412b. The reaction masses 412a, 412b are configured to slide along their respective guide members. For substantially contact-less (and hence substantially frictionless) gliding of the reaction masses 412a, 412b along the guide members 410a, 410 and 410c-410d, air bearings are provided (but not shown, but understood from FIG. 1) on the inside-facing surfaces of the reaction masses facing the guide members.

The reaction mass 412a defines a channel 450a and comprises a shelf 452a. Similarly, the reaction mass 412b defines a channel 450b and comprises a shelf 452b. Associated with the reaction mass 412a is a respective X,Y linear motor 454a and a respective Z,Y linear motor 456a. Similarly, associated with the reaction mass 412b is a respective X,Y linear motor 454b and a respective Z,Y linear motor 456b. The X,Y linear motor 454a comprises a coil assembly 458a, disposed in and along the channel 450a in the Y-direction, and a permanent-magnet array 460a mounted to the left side of the carrier 406 in the figure. Similarly, the X,Y linear motor 454b comprises a coil assembly 458b, disposed in and along the channel 450b in the Y-direction, and a permanent-magnet array 460b mounted to the right side of the carrier 406 in the figure. The Z, Y linear motor 456a comprises a coil assembly 462a, disposed on the shelf 452a and extending in the Y-direction, and a permanent-magnet array 464a mounted to the left under-edge of the carrier 406. Similarly, the Z, Y linear motor 456b comprises a coil assembly 462b, disposed on the shelf 452b and extending in the Y-direction, and a permanent-magnet array 464b mounted to the right under-edge of the carrier 406. Each of the linear motors 454a, 454b, 456a, 456b is a two-DOF linear motor, and these motors collectively provide the carrier with all six DOFs of motion. The Y-direction is the long-stroke direction, and all the other DOFs are short-stroke directions. With each linear motor 454a, 454b, 456a, 456b, the respective permanent-magnet array is situated in close, but non-contacting, opposition to the coil assembly.

The permanent-magnet arrays 460a, 464a, 460b, 464b in this embodiment are mounted to the carrier 406 and hence move along with motion of the moving assembly 405. This configuration of linear motors is called a "moving-magnet" configuration, as noted above. Electrical actuation of the coil assemblies 454a, 462a, 454b, 462b generates magnetic forces interacting between the coil assemblies and the respective permanent-magnet arrays 460a, 464a, 460b, 464b. These forces cause relative motions of the reaction masses 412a-412 and the carrier 406 according to Newton's third law, as discussed in the first embodiment.

As in other embodiments the linear motors 454a, 456a, 454b, 456b provide magnetic levitation for the carrier 406 and other parts of the stage device 400. The magnetic levitations provide, inter alia, substantially friction-less bearings for movements imparted by the motors 454a, 456a, 454b, 456b. The stage device 400 also includes weight compensators 428a, 428b that help support the weight of the carrier 406 in a magnetically levitated manner. Each weight compensator 428a, 428b comprises a first member 430a, 430b and at least one respective second member 432a, 432b.

Position of the carrier 406 is determined interferometrically as in the first embodiment. To such end the stage device 400 is provided with multiple interferometers to determine carrier position in all of the six DOFs. Entry ports 434a, 434b for the Y-interferometers and for the Z-interferometers are provided on the carrier 406.

In contrast to the first and second embodiments, the third embodiment utilizes only four linear motors instead of five. All four linear motors 454a, 456a, 454b, 456b are used for scanning motion (in the Y long-stroke direction). Two linear motors 454a, 454b also provide at least motions in the X-direction, and two linear motors 456a, 456b also provide at least motions in the Z-direction. Selective actuation of all four linear motors also provides $\theta_X$, $\theta_Y$, $\theta_Z$ motions. However, the third embodiment does not provide a convenient way in which X-interferometer beams (arrow 470) can interact with the carrier 406 at the plane of the reticle 408 unless the X-interferometer beams were made to pass through the reaction mass 412a, for example. The reaction mass 412a, being directly thermally coupled to the linear motors 454a, 456a, heats up during use and becomes hotter than surrounding atmosphere or structure. This localized heating generates localized air turbulence. Particularly if the X-interferometer measurement and reference beams do not share a common path (which is the case if the X-interferometer uses a moving mirror, as it usually does), air turbulence encountered by the beams passing through the reaction mass 412a would cause measurement errors, which could be a problem in some applications.

In this embodiment the X,Y linear motors 454a, 454b can be regarded as a "single" X,Y linear motor that has been split longitudinally into two halves to place one half 454a relative to one side of the carrier 406 and the other half 454b relative to the opposing side of the carrier 406. Similarly, the Y,Z linear motors 456a, 456b can be regarded as a "single" Y, Z linear motor that has been split longitudinally into two portions to place one portion 456a relative to one side of the carrier 406 and the other portion 456b relative to the opposing side of the carrier. This arrangement allows motive forces to be applied as closely as practicable to the CG of the carrier 406. It may be possible in some applications to omit one of these portions from one or both motors.

In the various embodiments described above, actuation of the carrier in the six DOFs is achieved using linear motors. Linear motors are an important (but not the only) representatives of a group of actuators generally termed "electromotive" (EM) actuators. Development of new types of electromotive actuators, especially that provide linear motion along one or more axes of motion, is ongoing. Incorporation and use of other EM actuators that achieve similar types of motions as described herein are regarded as within the scope of this disclosure.

Also, the various embodiments described herein utilize reaction masses that move in response to motions of the carrier, at least in one direction. Alternative embodiments can have different types of reaction masses than those described herein, or no reaction masses at al.

The various embodiments each comprise multiple linear EM actuators (generally called "linear motors" in the various descriptions). At least some of the linear motors are two-DOF linear motors; in some embodiments all the linear motors are two-DOF linear motors. For example, the first and second embodiments described above comprised four two-DOF linear motors (all being Y-Z linear motors) and a single one-DOF linear motor (for X-direction motion). The third embodiment comprised four two-DOF linear motors (two being Y-Z linear motors and two being X-Y linear motors). Since at least some of the linear motors are two-DOF linear motors, the total number of linear motors required to achieve all six DOFs of carrier motion is less than six. In other words, six DOFs of motion are achieved without having to use separate one-DOF actuators for each DOF of motion.

Lithography System

Figure 8:
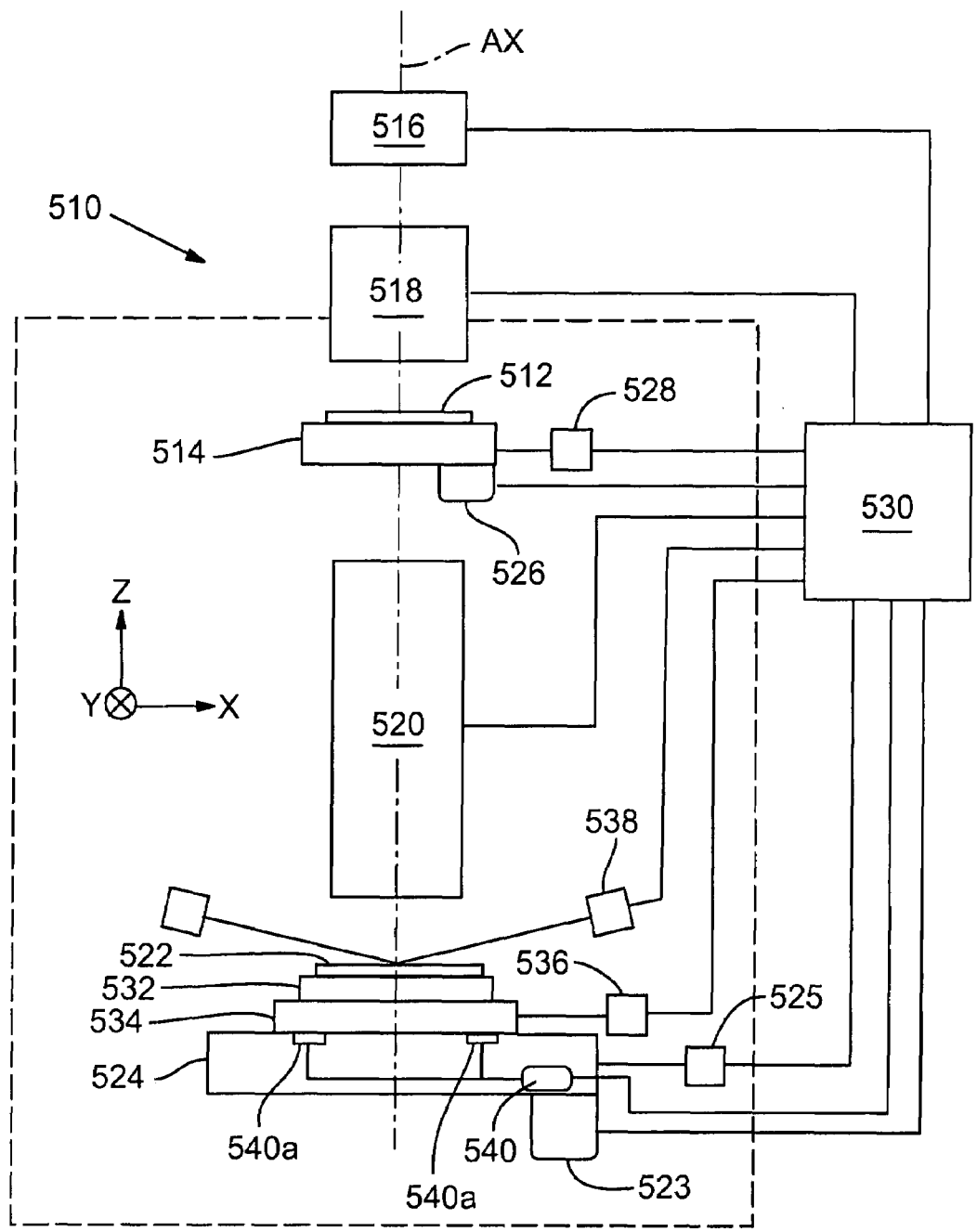
FIG. 8 is an elevational schematic diagram showing certain aspects of an exemplary projection-microlithography system that includes at least one stage device as disclosed herein.

An exemplary microlithography system 510 with which any of the foregoing embodiments can be used is depicted in FIG. 8, which depicts an example of a projection-exposure system. A pattern is defined on a reticle 512 mounted on a reticle stage 514. The reticle stage 514 can be (and desirably is) configured according to any of various embodiments including those described above. The reticle 512 is illuminated by an energy beam (e.g., DUV light) produced by a source 516 and passed through an illumination-optical system 518. As the energy beam passes through the reticle 512, the beam acquires an ability to form an image, of the illuminated portion of the reticle 512, downstream of the reticle. The beam passes through a projection-optical system 520 that focuses the beam on a sensitive surface of a substrate 522 held on a substrate stage ("wafer stage") 524. As shown in the figure, the source 516, illumination-optical system 518, reticle stage 514, projection-optical system 520, and wafer stage 524 generally are situated relative to each other along an optical axis AX. Actuators (linear motors) 526, as described above, move the carrier of the reticle stage 514 as desired in any of the six DOFs, and the positions of the reticle stage 514 are detected by respective interferometers 528. The system 510 is controlled by a system controller (computer) 530.

The substrate 522 (also termed a "wafer") is mounted on the wafer stage 524 by a wafer chuck 532. The wafer chuck 532 can be mounted to a wafer table 534 (also termed a "leveling table"). The wafer stage 524 not only holds the wafer 522 for exposure (with the resist facing in the upstream direction) but also provides for controlled movements of the wafer 522 as required for exposure and for alignment purposes. The wafer stage 524 plus wafer table 534 can be configured according to any of various embodiments such as those discussed above. Movements of the wafer stage 524 and wafer table 534 are effected by actuators 523 (linear motors), and positions of the wafer stage 524 and wafer table 534 are determined by respective interferometers 525, 536.

The wafer chuck 532 is configured to hold the wafer 522 firmly for exposure and to facilitate presentation of a planar sensitive surface of the wafer 522 for exposure. The wafer 522 usually is held to the surface of the wafer chuck 532 by vacuum, although other techniques such as electrostatic attraction can be employed under certain conditions. The wafer chuck 532 also facilitates the conduction of heat away from the wafer 522 that otherwise would accumulate in the wafer during exposure.

Movements of the wafer table 534 in the Z-direction and tilts of the wafer table 534 typically are made to establish or restore proper focus of the image, formed by the projection-optical system 520, on the sensitive surface of the wafer 522. "Focus" relates to the position of the exposed portion of the wafer 522 relative to the projection-optical system 520. Focus usually is determined automatically, using an auto-focus (AF) device 538. The AF device 538 produces data that is routed to the system controller 530. If the focus data produced by the AF device 538 indicates existence of an out-of-focus condition, then the system controller 530 produces a "leveling command" that is routed to a wafer-table controller 540 connected to individual wafer-table actuators 540a. Energization of the wafer-table actuators 540a results in movement and/or tilting of the wafer table 534 serving to restore proper focus.

The system 510 can be any of various types. For example, as an alternative to operating in a "step-and-repeat" manner characteristic of steppers, the system can be a scanning-type system operable to expose the pattern from the reticle 512 to the wafer 522 while continuously scanning both the reticle 512 and wafer 522 in a synchronous manner. During such scanning, the reticle 512 and wafer 522 are moved synchronously in opposite directions perpendicular to the optical axis AX. The scanning motions are performed by the respective stages 514, 524.

In contrast, a step-and-repeat system performs exposure only while the reticle 512 and wafer 522 are stationary. If the system is an "optical lithography" system, the wafer 522 typically is in a constant position relative to the reticle 512 and projection-optical system 520 during exposure of a given pattern field. After the particular pattern field is exposed, the wafer 522 is moved, perpendicularly to the optical axis Ax and relative to the reticle 512, to place the next field of the wafer 522 into position for exposure. In such a manner, images of the reticle pattern are sequentially exposed onto respective fields on the wafer 522.

Systems as described above are not limited to those used for manufacturing microelectronic devices. As a first alternative, for example, the lithography system can be used for transferring a pattern for a liquid-crystal display (LCD) onto a glass plate. As a second alternative, the system can be used for manufacturing thin-film magnetic heads. As a third alternative, the system can be a proximity-microlithography system used for exposing, for example, a mask pattern. In this alternative, the mask and substrate are placed in close proximity with each other, and exposure is performed without having to use a projection-optical system 520.

The principles set forth in the foregoing disclosure further alternatively can be used with any of various other apparatus, including (but not limited to) other microelectronic-processing apparatus, micromachining systems, inspection apparatus, and imaging apparatus.

In any of various lithography systems as described above, the source 516 (in the illumination-optical system 518) of illumination "light" can be, for example, a g-line source (436 nm), an i-line source (365 nm), a KrF excimer laser (248 nm), an ArF excimer laser (193 nm), or an $F_2$ excimer laser (157 nm). Alternatively, the source 516 can be of any other suitable exposure light or of charged particles.

With respect to the projection-optical system 520, if the illumination light comprises far-ultraviolet radiation, then the constituent lenses are made of UV-transmissive materials such as quartz and fluorite that readily transmit ultraviolet radiation. If the illumination light is produced by an $F_2$ excimer laser or EUV source, then the lenses of the projection-optical system 520 can be either refractive or catadioptric or both (depending upon the wavelength and other factors), and the reticle 512 desirably is a reflective type. If the illumination light is in the vacuum ultraviolet (VUV) range (less than 200 nm), then the projection-optical system 520 can have a catadioptric configuration with beam splitter and concave mirror, as disclosed for example in U.S. Pat. Nos. 5,668,672 and 5,835,275, incorporated herein by reference. The projection-optical system 520 also can have a reflecting-refracting configuration including a concave mirror but not a beam splitter, as disclosed in U.S. Pat. Nos. 5,689,377 and 5,892,117, incorporated herein by reference.

Movement of a stage 514, 524 as described herein can generate reaction forces that can affect the performance of the exposure apparatus. Reaction forces generated by motion of the wafer stage 524 and not canceled by movement of reaction masses can be shunted to the floor (ground) using a frame member as described, e.g., in U.S. Pat. No. 5,528,118, incorporated herein by reference. Reaction forces generated by motion of the reticle stage 514 can be shunted to the floor (ground) using a frame member as described in U.S. Pat. No. 5,874,820, incorporated herein by reference.

A lithography system such as any of the various types described above can be constructed by assembling together the various subsystems, including any of the elements listed in the appended claims, in a manner ensuring that the prescribed mechanical accuracy, electrical accuracy, and optical accuracy are obtained and maintained. For example, to maintain the various accuracy specifications, before and after assembly, optical-system components and assemblies are adjusted as required to achieve maximal optical accuracy. Similarly, mechanical and electrical systems are adjusted as required to achieve maximal respective accuracies. Assembling the various subsystems into a lithography system requires the making of mechanical interfaces, electrical-circuit wiring connections, and pneumatic plumbing connections as required between the various subsystems. Typically, constituent subsystems are assembled prior to assembling the subsystems into a complete system. After assembly of the system, adjustments are made as required for achieving overall system specifications in accuracy, etc. Assembly at the subsystem and system levels desirably is performed in a clean room where temperature and humidity are controlled.

Semiconductor-Device Fabrication

Figure 9:
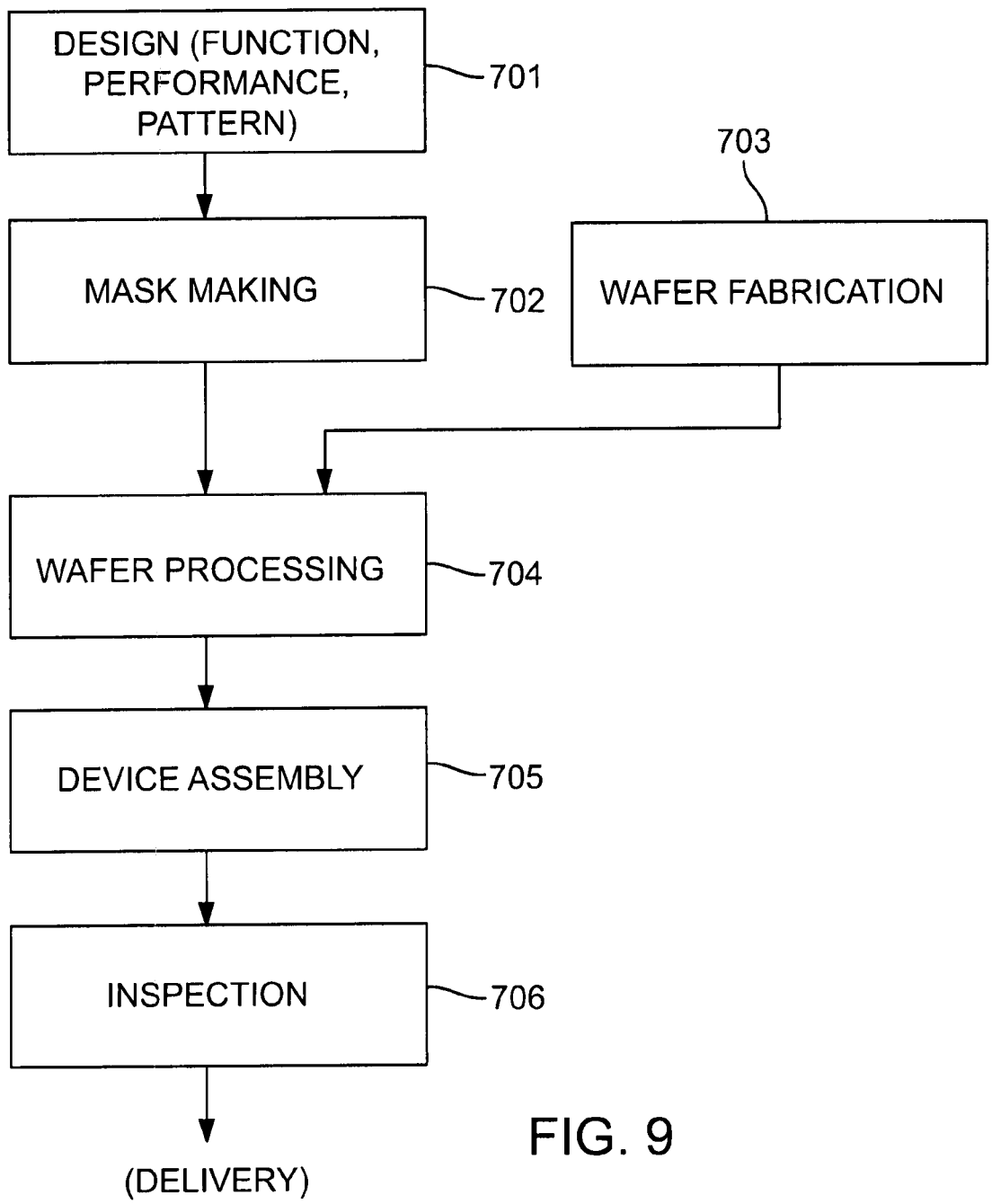
FIG. 9 is a block diagram of an exemplary semiconductor-device fabrication process that includes wafer-processing steps including a lithography step.

Semiconductor devices can be fabricated by processes including microlithography steps performed using a microlithography system as described above. Referring to FIG. 9, in step 701 the function and performance characteristics of the semiconductor device are designed. In step 702 a reticle (mask) defining the desired pattern is designed according to the previous design step. Meanwhile, in step 703, a substrate (e.g., wafer) is made and coated with a suitable resist. In step 704 the reticle pattern designed in step 702 is exposed onto the surface of the substrate using the microlithography system. In step 705 the semiconductor device is assembled (including, if applicable, "dicing" by which individual devices or "chips" are cut from the substrate, "bonding" by which wires are bonded to the particular locations on the chips, and "packaging" by which the devices are enclosed in appropriate packages for use). In step 706 the assembled devices are tested and inspected.

Figure 10:
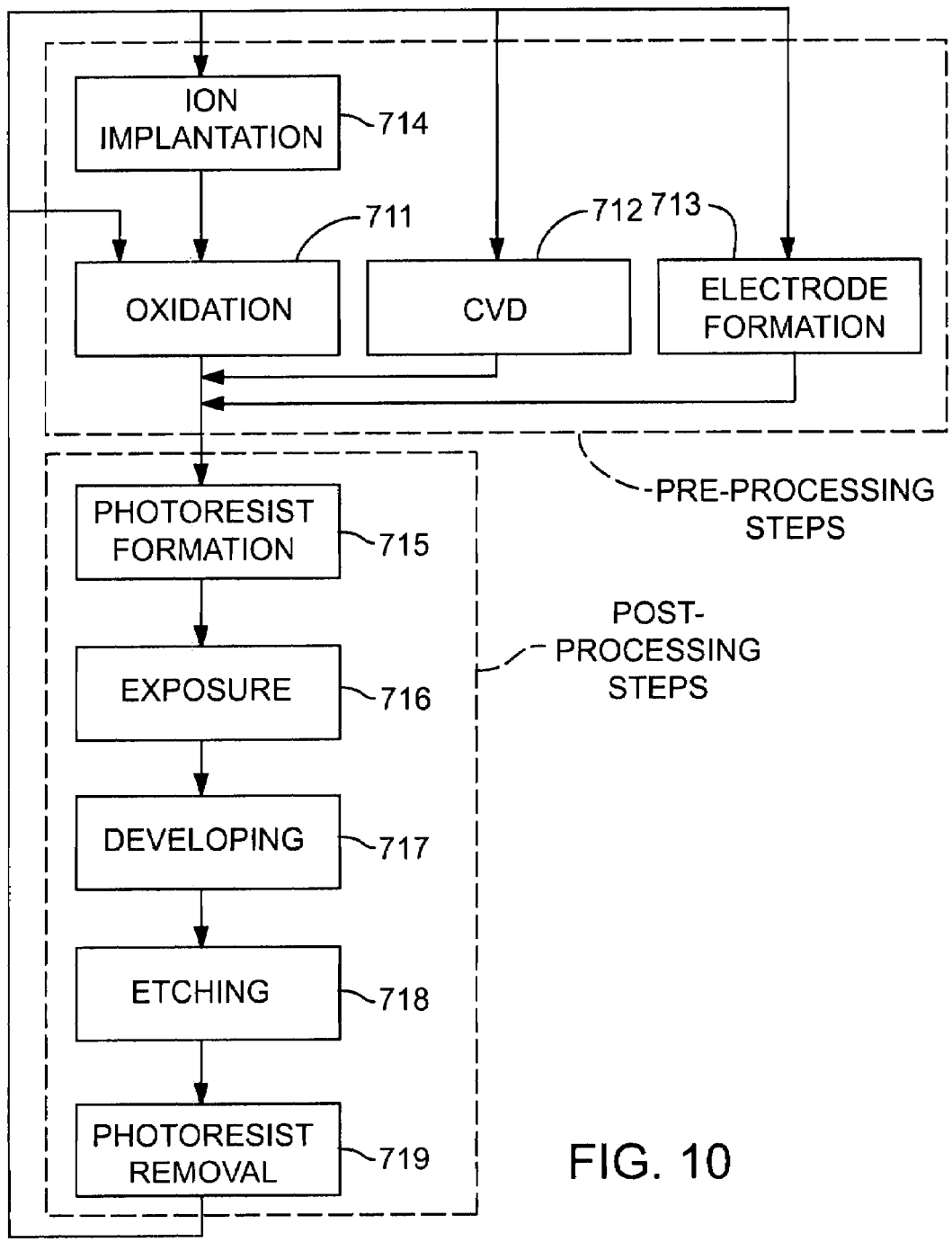
FIG. 10 is a block diagram of a wafer-processing process as referred to in FIG. 9.
Figure 11:
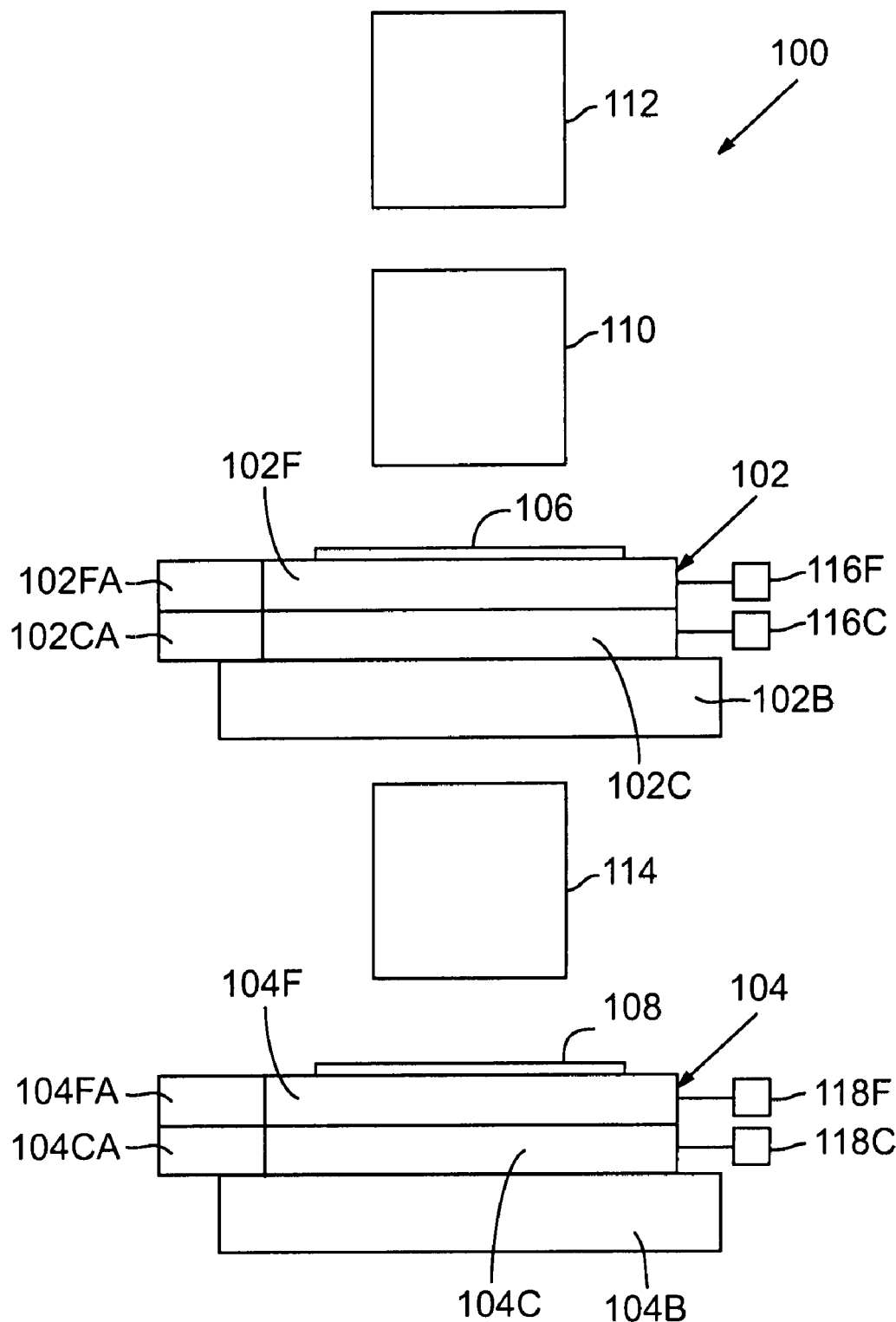
FIG. 11 is an elevational schematic diagram showing certain components of a conventional microlithography system.

Representative details of a wafer-processing process (as an exemplary substrate-processing method) including a microlithography step are shown in FIG. 10. In step 711 (oxidation) the wafer surface is oxidized. In step 712 (CVD) an insulative layer is formed on the wafer surface. In step 713 (electrode formation) electrodes are formed on the wafer surface by vapor deposition for example. In step 714 (ion implantation) ions are implanted in the wafer surface. These steps 711-714 constitute representative "pre-processing" steps for wafers, and selections are made at each step according to processing requirements.

At each stage of wafer processing, when the pre-processing steps have been completed, the following "post-processing" steps are implemented. A first post-process step is step 715

(photoresist formation) in which a suitable resist is applied to the surface of the wafer. Next, in step 716 (exposure), the microlithography system described above is used for lithographically transferring a pattern from the reticle to the resist layer on the wafer. In step 717 (development) the exposed resist on the wafer is developed to form a usable mask pattern, corresponding to the resist pattern, in the resist on the wafer. In step 718 (etching), regions not covered by developed resist (i.e., exposed material surfaces) are etched away to a controlled depth. In step 719 (photoresist removal), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

Whereas the disclosure was set forth in the context of various representative embodiments, it will be understood that the scope of the invention is not limited to those embodiments. On the contrary, the invention is intended to encompass all modifications, alternatives, and equivalents falling within the spirit and scope of the invention, as defined by the appended claims.

What is claimed is:

1. A stage device, comprising:
   a carrier;
   multiple linear EM actuators coupling the carrier monolithically to a base and collectively providing controlled movability of the carrier relative to the base in all six DOFs (X, Y, Z, $\theta_X$, $\theta_Y$, $\theta_Z$); and
   the multiple linear EM actuators comprising two multiple-DOF linear actuators providing movability of the carrier in at least four DOFs and at least a third linear EM actuator providing movability of the carrier in at least one DOF not provided by the two multiple-DOF linear actuators.

2. The stage device of claim 1, wherein:
   the at least one multiple-DOF linear actuator comprises a first actuator portion extending along a first side of the carrier and a second actuator portion extending along a second side of the carrier; and
   the first and second actuator portions are operable substantially synchronously in at least one of the X, Y, and Z DOFs.

3. The stage device of claim 1, wherein:
   the two multiple-DOF linear actuators comprise a first two-DOF linear motor and a second two-DOF linear motor collectively providing movability of the carrier in two of X, Y, and Z DOFs and at least two of $\theta_X$, $\theta_Y$, and $\theta_Z$ DOFs; and
   the at least a third linear EM actuator is a one- or two-DOF linear motor providing movability of the carrier in the remaining one of the X, Y, and Z DOF not provided by the first and second two-DOF linear motors.

4. The stage device of claim 1, wherein the multiple linear EM actuators comprise at least two two-DOF linear motors.

5. The stage device of claim 4, wherein:
   the at least two two-DOF linear motors comprise a first linear motor providing movement of the carrier in X and Y DOFs and a second linear motor providing movement of the carrier in Y and Z DOFs, the Y DOF representing a long-stroke direction; and
   the first and second linear motors collectively provide movements of the carrier relative to the base in $\theta_X$, $\theta_Y$, and $\theta_Z$ DOFs.

6. The stage device of claim 1, wherein the carrier is a reticle carrier.

7. The stage device of claim 1, further comprising at least one reaction mass coupled to move, relative to the base, in coordination with the carrier in at least one of the X, Y, and Z DOFs.

8. The stage device of claim 7, wherein:
   one of the X, Y, and Z DOFs is a long-stroke direction; and
   the at least one reaction mass moves in the long-stroke direction.

9. A stage device, comprising:
   a carrier having first and second opposing regions;
   a first two-DOF linear motor coupled to the first region of the carrier and configured to provide, when actuated, motion of the carrier relative to a base in two of X, Y, and Z DOFs;
   a second two-DOF linear motor coupled to the second region of the carrier and configured to provide, when actuated in coordination with the first two-DOF linear motor, motion of the carrier relative to the base in two of X, Y, and Z DOFs; and
   a third linear motor coupled to the carrier and configured to provide, when actuated, motion of the carrier relative to the base at least in the remaining of the X, Y, and Z DOFs;
   the first, second, and third linear motors being further configured to provide, when actuated in coordination with each other, motion of the carrier relative to the base in all six DOFs (X, Y, Z, $\theta_X$, $\theta_Y$, $\theta_Z$).

10. The stage device of claim 9, wherein the second two-DOF linear motor provides motion of the carrier relative to the base in the same two of the X, Y, and Z DOFs as the first two-DOF linear motor.

11. The stage device of claim 10, wherein:
    the first and second two-DOF linear motors are configured to provide motion of the carrier in the Z and Y DOFs relative to the base; and
    the third linear motor is a one-DOF linear motor configured to provide motion of the carrier in the X DOF relative to the base.

12. The stage device of claim 11, wherein:
    the Y DOF represents a long-stroke direction; and
    the Z and X DOFs represent short-stroke directions.

13. The stage device of claim 10, wherein the first and second two-DOF linear motors additionally provide the motion of the carrier in the $\theta_X$, $\theta_Y$, and $\theta_Z$ DOFs relative to the base.

14. The stage device of claim 9, wherein:
    the Y DOF represents a long-stroke direction of the carrier relative to the base; and
    the X and Z DOFs represent respective short-stroke directions of the carrier relative to the base.

15. The stage device of claim 14, further comprising a reaction mass movable in the long-stroke direction in coordination with movement of the carrier relative to the base.

16. The stage device of claim 9, wherein the first and second two-DOF linear motors each have a moving-magnet configuration in which respective magnet arrays of the first and second two-DOF linear motors are coupled to the carrier.

17. The stage device of claim 16, wherein the third linear motor has a moving-magnet configuration.

18. The stage device of claim 9, wherein:
    the carrier has an obverse surface and a reverse surface; and
    the first and second two-DOF linear motors each have a respective obverse-surface portion disposed on the obverse surface and a respective reverse-surface portion disposed on the reverse surface.

19. The stage device of claim 9, wherein the carrier is at least partially magnetically levitated relative to the base.

20. The stage device of claim 19, further comprising a weight compensator including a first portion mounted to the carrier and a second portion coupled to the base, the first and second portions being magnetically interactive with each other.

21. The stage device of claim 9, wherein each of the first and second two-DOF linear motors is coupled to a respective reaction mass that moves relative to the base in response to actuation of the respective linear motor.

22. The stage device of claim 21, wherein:
the base comprises multiple guide members extending parallel to each other; and
each reaction mass is configured to slide on a respective guide member.

23. The stage device of claim 9, wherein the carrier is a reticle carrier.

24. The stage device of claim 9, wherein the carrier is monolithic relative to the base.

25. A reticle stage, comprising:
a monolithic reticle carrier having first and second opposing regions;
a first two-DOF linear motor coupled to the first region of the carrier and configured to provide, when actuated, motion of the carrier relative to a base in two of X, Y, and Z DOFs;
a second two-DOF linear motor coupled to the second region of the carrier and configured to provide, when actuated in coordination with the first two-DOF linear motor, motion of the carrier relative to the base in the two of the X, Y, and Z DOFs; and
a third linear motor coupled to the carrier and configured to provide, when actuated, motion of the carrier relative to the base in the remaining of the X, Y, and Z DOFs;
the first, second, and third linear motors being further configured to provide, in coordination with each other, motion of the carrier relative to the base in all six DOFs ($X, Y, Z, \theta_X, \theta_Y, \theta_Z$).

26. The reticle stage of claim 25, wherein:
the first and second two-DOF linear motors are configured to provide motion of the carrier in the Z and Y DOFs relative to the base, wherein the Y DOF represents a long-stroke direction and the Z DOF represents a short-stroke direction; and
the third linear motor is a one-DOF linear motor configured to provide motion of the carrier in the X DOF relative to the base.

27. The reticle stage of claim 26, wherein the X DOF represents a short-stroke direction.

28. The reticle stage of claim 26, further comprising at least one reaction mass movable in the long-stroke direction in coordination with movement of the carrier relative to the base.

29. The reticle stage of claim 28, wherein:
the base comprises at least one guide member; and
the at least one reaction mass is mounted to a respective guide member via at least one respective bearing.

30. The reticle stage of claim 29, wherein the bearing is a gas bearing.

31. The reticle stage of claim 25, wherein:
the first and second two-DOF linear motors each have a moving-magnet configuration in which respective magnet arrays of the first and second two-DOF linear motors are coupled to the carrier; and
the third linear motor has a moving-magnet configuration.

32. The reticle stage of claim 25, wherein:
the carrier has an obverse surface and a reverse surface; and
the first and second two-DOF linear motors each have a respective obverse-surface portion disposed on the obverse surface and a respective reverse-surface portion disposed on the reverse surface.

33. The reticle stage of claim 25, wherein the carrier is at least partially magnetically levitated relative to the base.

34. The reticle stage of claim 33, further comprising a weight compensator including a first portion mounted to the carrier and a second portion coupled to the base, the first and second portions being magnetically interactive with each other.

35. A microlithography system, comprising:
a substrate stage;
an optical system disposed relative to the substrate stage; and
a reticle stage, as recited in claim 25, disposed relative to the optical system.

* * * * *